(12) United States Patent
Kitazawa et al.

(10) Patent No.: US 11,792,986 B2
(45) Date of Patent: Oct. 17, 2023

(54) DUAL SACRIFICIAL MATERIAL REPLACEMENT PROCESS FOR A THREE-DIMENSIONAL MEMORY DEVICE AND STRUCTURE FORMED BY THE SAME

(71) Applicant: SANDISK TECHNOLOGIES LLC, Addison, TX (US)

(72) Inventors: Keigo Kitazawa, Nagoya (JP); Naoto Norizuki, Yokkaichi (JP); Shunsuke Takuma, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 274 days.

(21) Appl. No.: 17/233,799

(22) Filed: Apr. 19, 2021

(65) Prior Publication Data
US 2022/0336486 A1 Oct. 20, 2022

(51) Int. Cl.
*H10B 43/27* (2023.01)
*H10B 41/27* (2023.01)
*H10B 51/20* (2023.01)
*H10B 63/00* (2023.01)

(52) U.S. Cl.
CPC ............. *H10B 43/27* (2023.02); *H10B 41/27* (2023.02); *H10B 51/20* (2023.02); *H10B 63/34* (2023.02); *H10B 63/845* (2023.02)

(58) Field of Classification Search
CPC ........ H10B 43/27; H10B 41/27; H10B 51/20; H10B 63/34; H10B 63/845; H10B 41/10; H10B 43/10; H10B 51/10; H10B 63/84
See application file for complete search history.

(56) References Cited

U.S. PATENT DOCUMENTS

| | | | |
|---|---|---|---|
| 8,349,681 B2 | 1/2013 | Alsmeier et al. | |
| 9,252,151 B2 | 2/2016 | Chien et al. | |
| 9,576,975 B2 | 2/2017 | Zhang et al. | |
| 9,875,929 B1 | 1/2018 | Shukla et al. | |
| 10,707,233 B1* | 7/2020 | Cui | H01L 21/02208 |
| 11,398,496 B2* | 7/2022 | Kai | H01L 29/4234 |
| 2006/0151818 A1 | 7/2006 | Toumiya | |
| 2012/0001247 A1 | 1/2012 | Alsmeier | |
| 2012/0001249 A1 | 1/2012 | Alsmeier et al. | |
| 2015/0008505 A1 | 1/2015 | Chien et al. | |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Allison Bernstein
(74) *Attorney, Agent, or Firm* — THE MARBURY LAW GROUP PLLC

(57) ABSTRACT

A vertical repetition of a unit layer stack includes an insulating layer, a first sacrificial material layer, another insulating layer, and a second sacrificial material layer. A memory opening is formed through the vertical repetition, and a memory opening fill structure is formed in the memory opening. A backside trench is formed through the alternating stack. The first sacrificial material layers are replaced with first electrically conductive layers, and the second sacrificial material layer are replaced with second electrically conductive layers after formation of the first electrically conductive layers.

13 Claims, 36 Drawing Sheets

(56) References Cited

U.S. PATENT DOCUMENTS

2016/0086972 A1 3/2016 Zhang et al.
2020/0402905 A1 12/2020 Otsu et al.

OTHER PUBLICATIONS

U.S. Appl. No. 17/169,987, filed Feb. 8, 2021, SanDisk Technologies LLC.
U.S. Appl. No. 17/189,153, filed Mar. 1, 2021, SanDisk Technologies LLC.
U.S. Appl. No. 17/192,463, filed Mar. 4, 2021, SanDisk Technologies LLC.
ISR—Notification of Transmittal of the International Search Report and Written Opinion of the International Searching Authority for International Patent Application No. PCT/US2022/012673, dated May 4, 2022, 13 pages.

\* cited by examiner

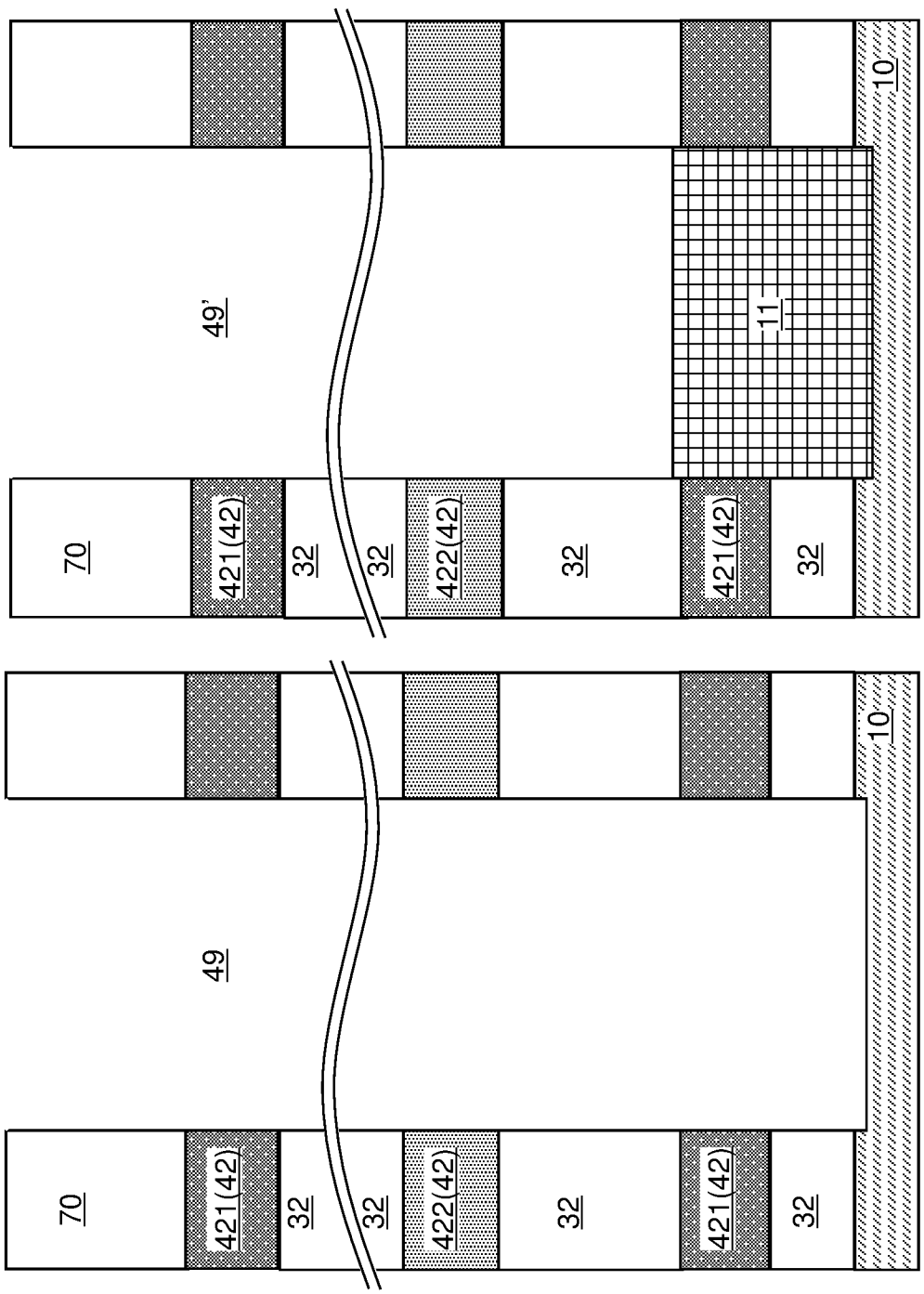

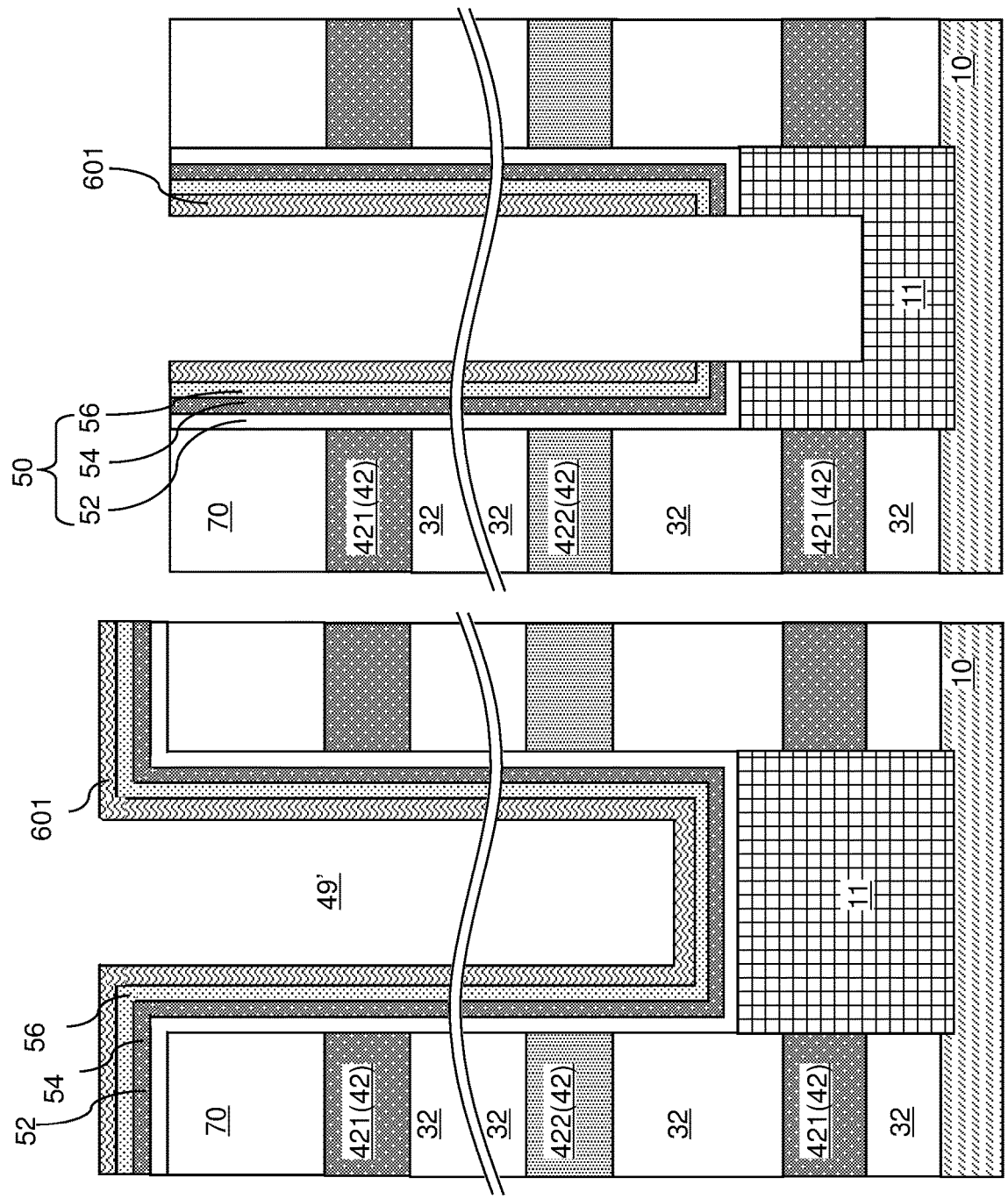

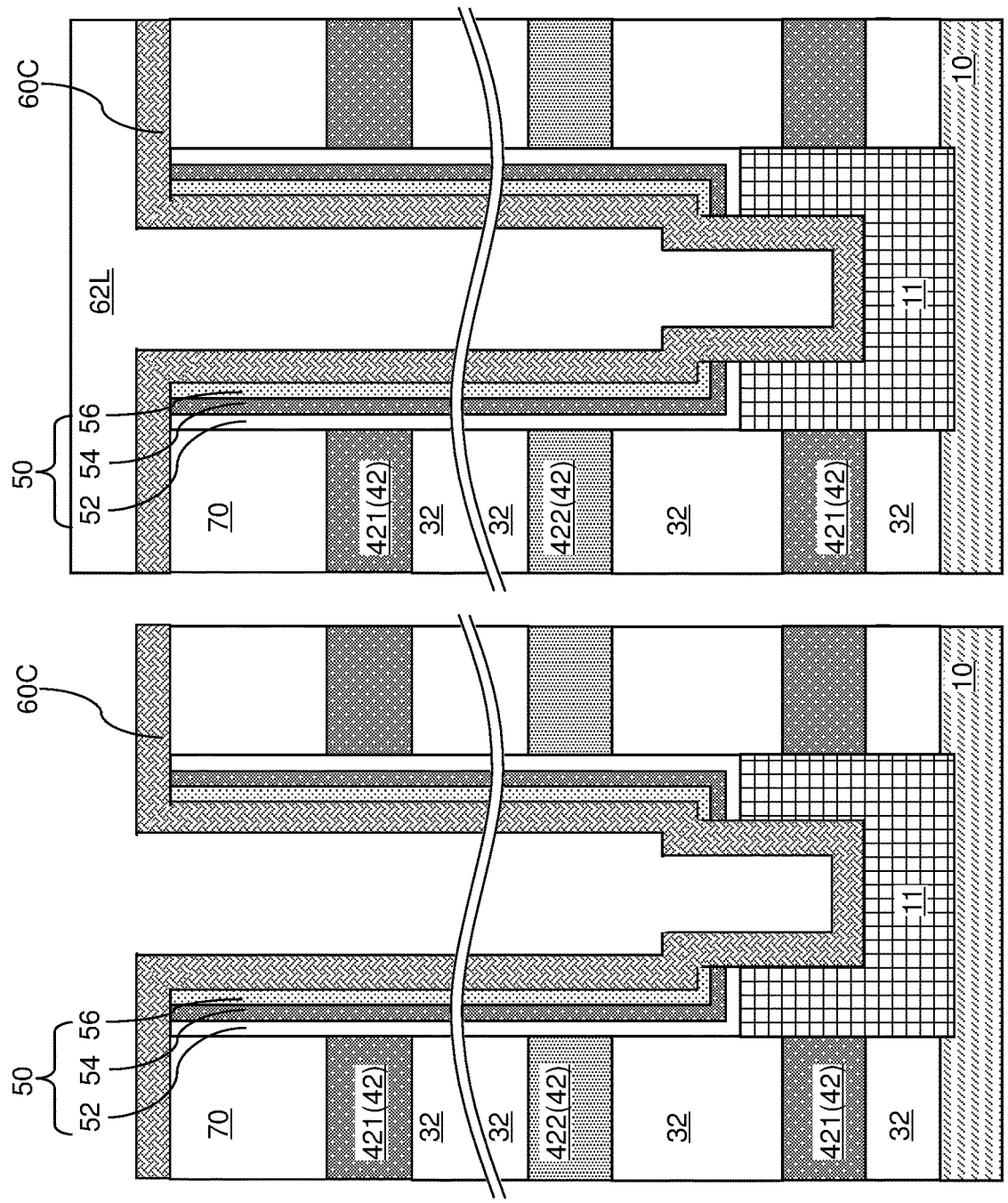

DUAL SACRIFICIAL MATERIAL REPLACEMENT PROCESS FOR A THREE-DIMENSIONAL MEMORY DEVICE AND STRUCTURE FORMED BY THE SAME

FIELD

The present disclosure relates generally to the field of semiconductor devices, and particularly to a dual sacrificial material replacement process for forming word lines of a three-dimensional memory device and structures formed by the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device is provided, which comprises: an alternating stack of insulating layers and electrically conductive layers; a memory opening vertically extending through the alternating stack; a memory opening fill structure located in the memory opening and comprising a vertical semiconductor channel and a vertical stack of memory elements located at levels of the electrically conductive layers; a backside trench vertically extending through the alternating stack; and a backside trench fill structure comprising a backside insulating material portion, wherein: the electrically conductive layers comprise a vertically alternating sequence of first electrically conductive layers and second electrically conductive layers that are interlaced along a vertical direction; each of the first electrically conductive layers is laterally spaced from the backside insulating material portion by a respective dielectric spacer plate; and each of the second electrically conductive layers is in direct contact with the backside insulating material portion.

According to another aspect of the present disclosure, a method of forming a memory device is provided, which comprises: forming a vertical repetition of a unit layer stack over a substrate, wherein the unit layer stack comprises, from bottom to top or from top to bottom, an insulating layer, a first sacrificial material layer comprising a first sacrificial material, another insulating layer, and a second sacrificial material layer comprising a second sacrificial material different from the first sacrificial material; forming a memory opening through the vertical repetition; forming a memory opening fill structure in the memory opening, wherein the memory opening fill structure comprises a vertical stack of memory elements formed at levels of the sacrificial material layers and a vertical semiconductor channel; forming a backside trench through the vertical repetition; replacing the first sacrificial material layers with first electrically conductive layers; and replacing the second sacrificial material layers with second electrically conductive layers after formation of the first electrically conductive layers.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

DETAILED DESCRIPTION

Figure 1:
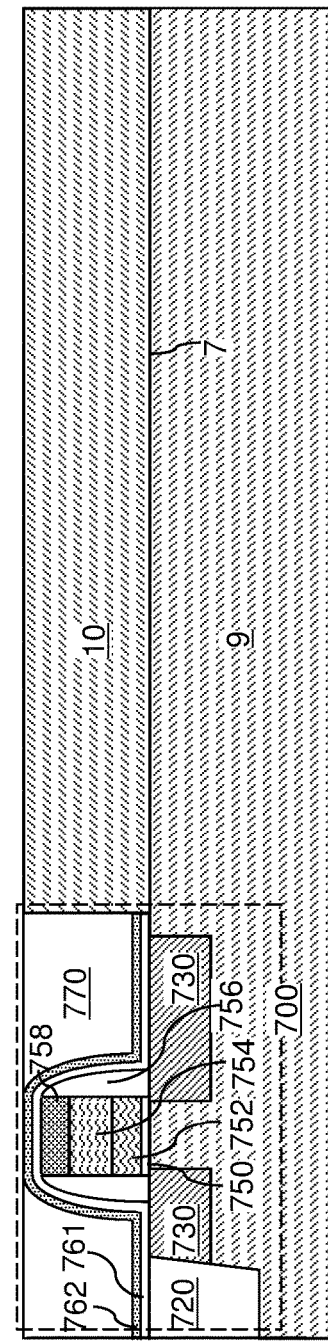
FIG. 1 is a schematic vertical cross-sectional view of an exemplary structure after formation of at least one peripheral device, a semiconductor material layer, and a gate dielectric layer according to an embodiment of the present disclosure.

As discussed above, the embodiments of the present disclosure are directed a dual sacrificial material replacement process for word lines of a three-dimensional memory device and structures formed by the same, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
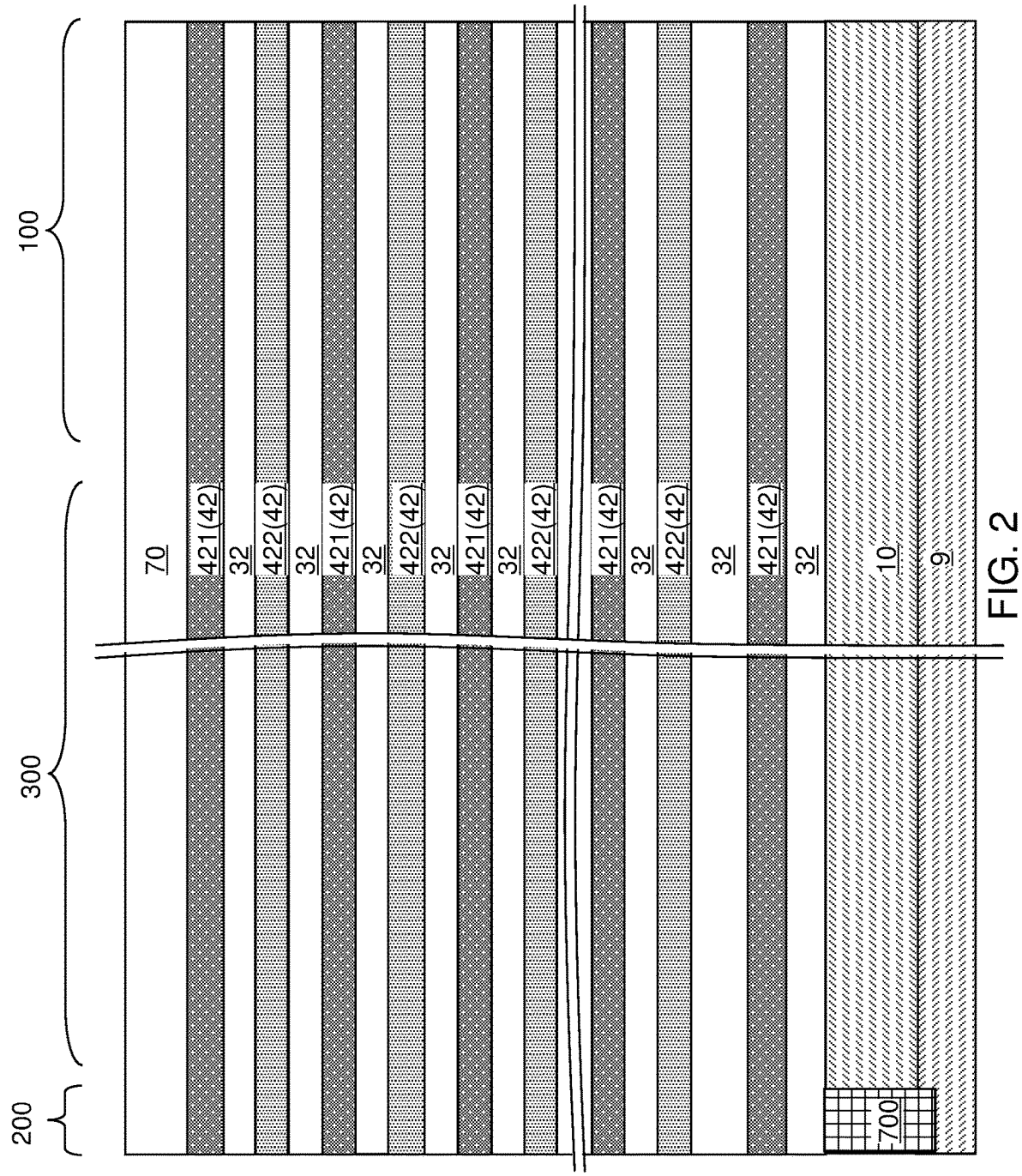
FIG. 2 is a schematic vertical cross-sectional view of the exemplary structure after formation of a vertical repetition of a unit layer stack according to an embodiment of the present disclosure.

Referring to FIG. 2, a vertical repetition of a unit layer stack (32, 421, 32, 422) is formed over the top surface of the substrate (9, 10). The unit layer stack (32, 421, 32, 422) can include, from bottom to top or from top to bottom, an insulating layer 32, a first sacrificial material layer 421 comprising a first sacrificial material, another insulating layer 32, and a second sacrificial material layer 422 comprising a second sacrificial material. The first sacrificial material layers 421 and the second sacrificial material layers 422 are collectively referred to as sacrificial material layers 42.

A bottommost insulating layer 32 may be formed directly on the top surface of the semiconductor material layer 10 prior to formation of a first instance of the unit layer stack (32, 421, 32, 422). The number of repetitions of the instances of the unit layer stack (32, 421, 32, 422) can be in a range from 2 to 1,024, such as from 8 to 256, although lesser and greater number of repetitions may also be employed.

Optionally, a partial layer set including a subset of layers within the unit layer stack (32, 421, 32, 422) may be formed above the vertical repetition of the unit layer stack (32, 421, 32, 422). For example, the partial layer set may include an insulating layer 32 and a first sacrificial material layer 421, or the partial layer set may include a second sacrificial material layer 422, or the partial layer set may include layer stack including, from bottom to top, a second sacrificial material layer 422, an insulating layer 32, and a first sacrificial material layer 421. An insulating cap layer 70 can be formed over, and on, a topmost one of the sacrificial material layers 42. The insulating cap layer 70 may have the same material composition as the insulating layers 32.

The layer stack formed over the semiconductor material layer 10 includes the vertical repetition of the unit layer stack (32, 421, 32, 422), an optional partial layer set, and the insulating cap layer 70. The insulating cap layer 70 may be formed as the topmost layer within the layer stack. Each vertically neighboring pair of two insulating layers 32 is vertically spaced from each other by a respective one of the sacrificial material layers 42. The topmost insulating layer 32 is vertically spaced from the insulating cap layer 70 by a topmost sacrificial material layer 42.

In one embodiment, upon sequentially numbering the sacrificial material layers 42 from bottom to top with positive integers beginning with 1, each odd-numbered sacrificial material layer 42 may be a first sacrificial material layer 421 and each even-numbered sacrificial material layer 42 may be a second sacrificial material layer 422. Alternatively, upon sequentially numbering the sacrificial material layers 42 from bottom to top with positive integers beginning with 1, each even-numbered sacrificial material layer 42 may be a first sacrificial material layer 421 and each odd-numbered sacrificial material layer 42 may be a second sacrificial material layer 422.

In one embodiment, the insulating layers 32 can include a silicon oxide material such as undoped silicate glass or a doped silicate glass. A plasma-enhanced chemical vapor deposition (PECVD) process may be employed to deposit the insulating layers 32. For example, if silicon oxide is employed for the insulating layers 32, tetraethyl orthosilicate (TEOS) can be employed as the precursor material for the PECVD process. The thickness of each insulating layer 32 may be in a range from 20 nm to 50 nm, although lesser and greater thicknesses may also be employed. In one embodiment, the insulating layers 32 may have a same thickness. The insulating cap layer 70 may include the same material as the insulating layers 32, and may have a thickness in a range from 20 nm to 80 nm, although lesser and greater thicknesses may also be employed.

According to an aspect of the present disclosure, the first sacrificial material layers 421 include a first non-oxide sacrificial material having a first oxidation rate under an oxidation process (such as a thermal oxidation process or a plasma oxidation process), and the second non-oxide sacrificial material layers 422 include a second sacrificial material having a second oxidation rate under the oxidation process that is higher than the first oxidation rate. The ratio of the second oxidation rate to the first oxidation rate may be in a range from 1.5 to 10, such as from 2 to 5.

In a first non-limiting illustrative example, the first sacrificial material layers 421 comprise a first silicon nitride material having a first refractive index, and the second sacrificial material layers 422 comprise a second silicon nitride material having a second refractive index which is different from the first refractive index. The first refractive index may be lower by at least 5%, such as 5 to 15%, for example 7 to 10% than the second refractive index. For example, the first refractive index may be 1.75 to 1.82, such as 1.8 to 1.82, while the second refractive index may be 1.85 to 1.97, such as 1.94 to 1.96. In one embodiment, first silicon nitride material may have a first density, and the second silicon nitride material may have a second density higher than the first density. The second density may be lower by at least 5%, such as 5 to 15%, for example 7 to 10% than the first density. The lower density, lower refractive index silicon nitride material may be deposited by plasma enhanced chemical vapor deposition (PECVD) with a higher plasma power, while the higher density, higher refractive index silicon nitride material may be deposited by PECVD with a lower plasma power.

In a second non-limiting illustrative example, the first sacrificial material layers 421 comprise a silicon nitride material, and the second sacrificial material layers 422 comprise a semiconductor material, such as amorphous silicon or silicon germanium.

The thickness of each of the first sacrificial material layers 421 and the second sacrificial material layers 422 may be in a range from 20 nm to 50 nm, although lesser and greater thicknesses may also be employed. In one embodiment, the sacrificial material layers 42 may have a same thickness.

Figure 3:
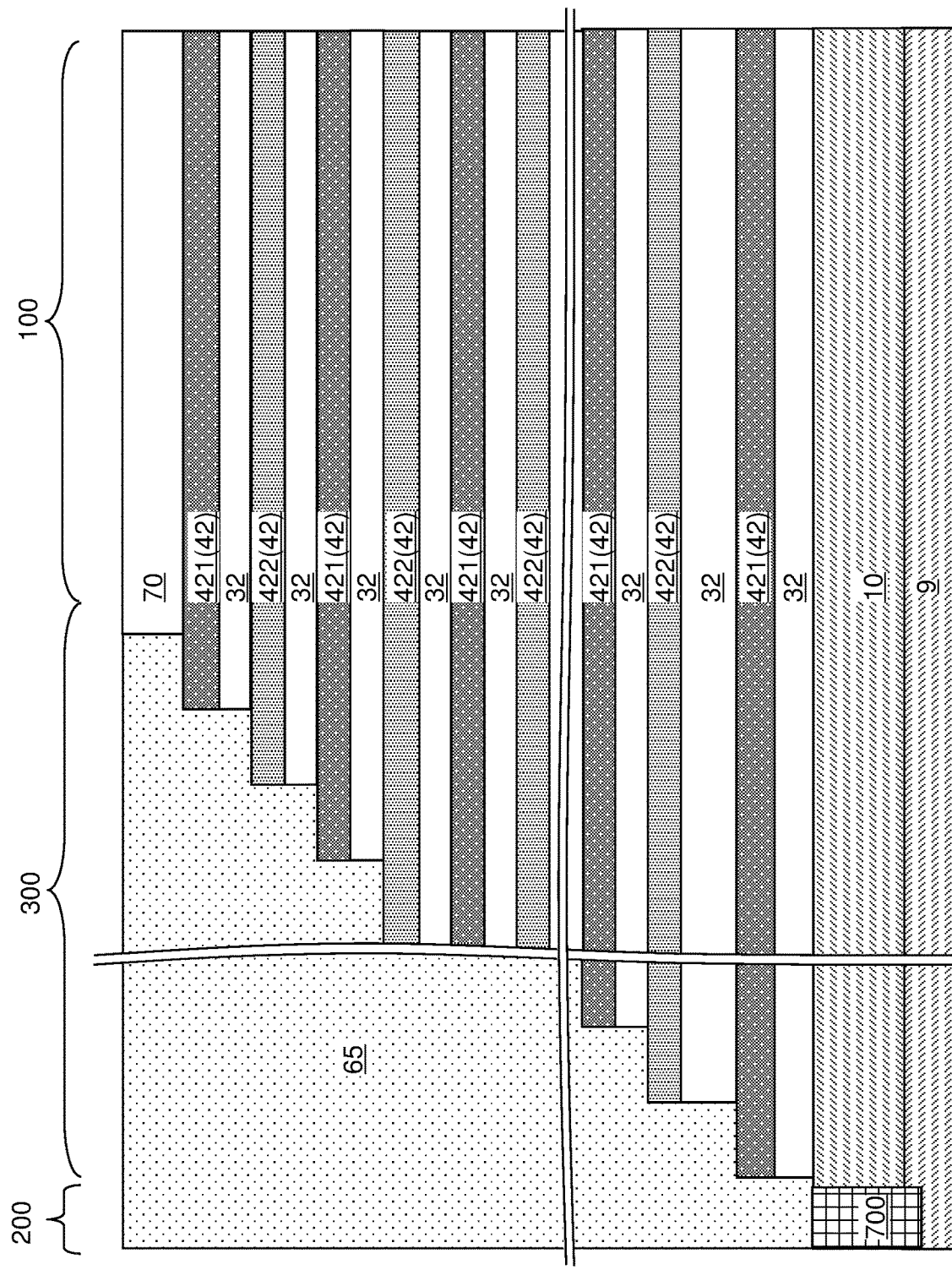
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at in the contact region 300 at an end portion of the vertical repetition (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the vertical repetition (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the vertical repetition (32, 42) laterally extends farther than any overlying sacrificial material layer 42 within the vertical repetition (32, 42) in the terrace region. The terrace region includes stepped surfaces of the vertical repetition (32, 42) that continuously extend from a bottommost layer within the vertical repetition (32, 42) to a topmost layer within the vertical repetition (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
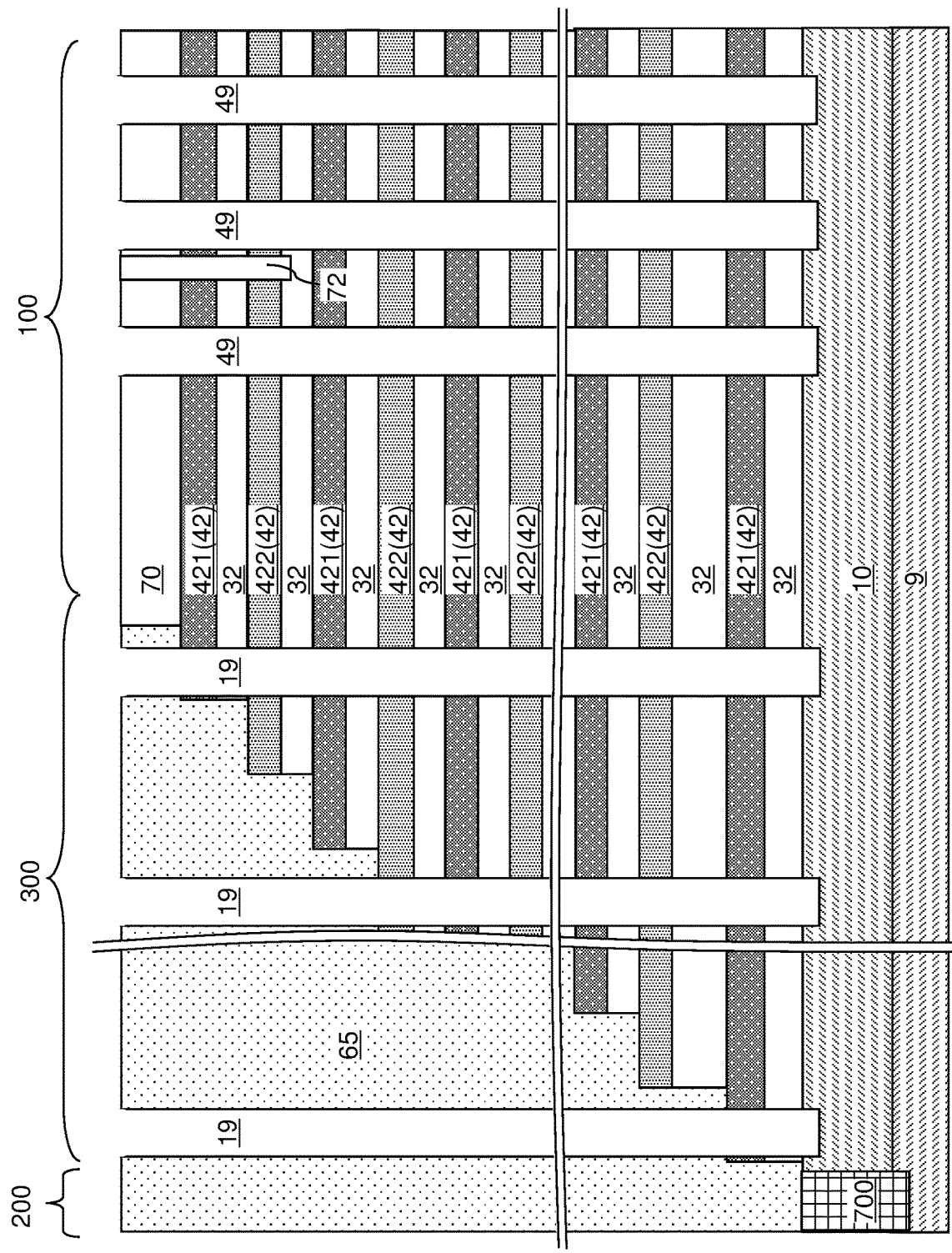
FIG. 4A is a schematic vertical cross-sectional view of the exemplary structure after formation of memory openings and support openings according to an embodiment of the present disclosure.
Figure 4B:
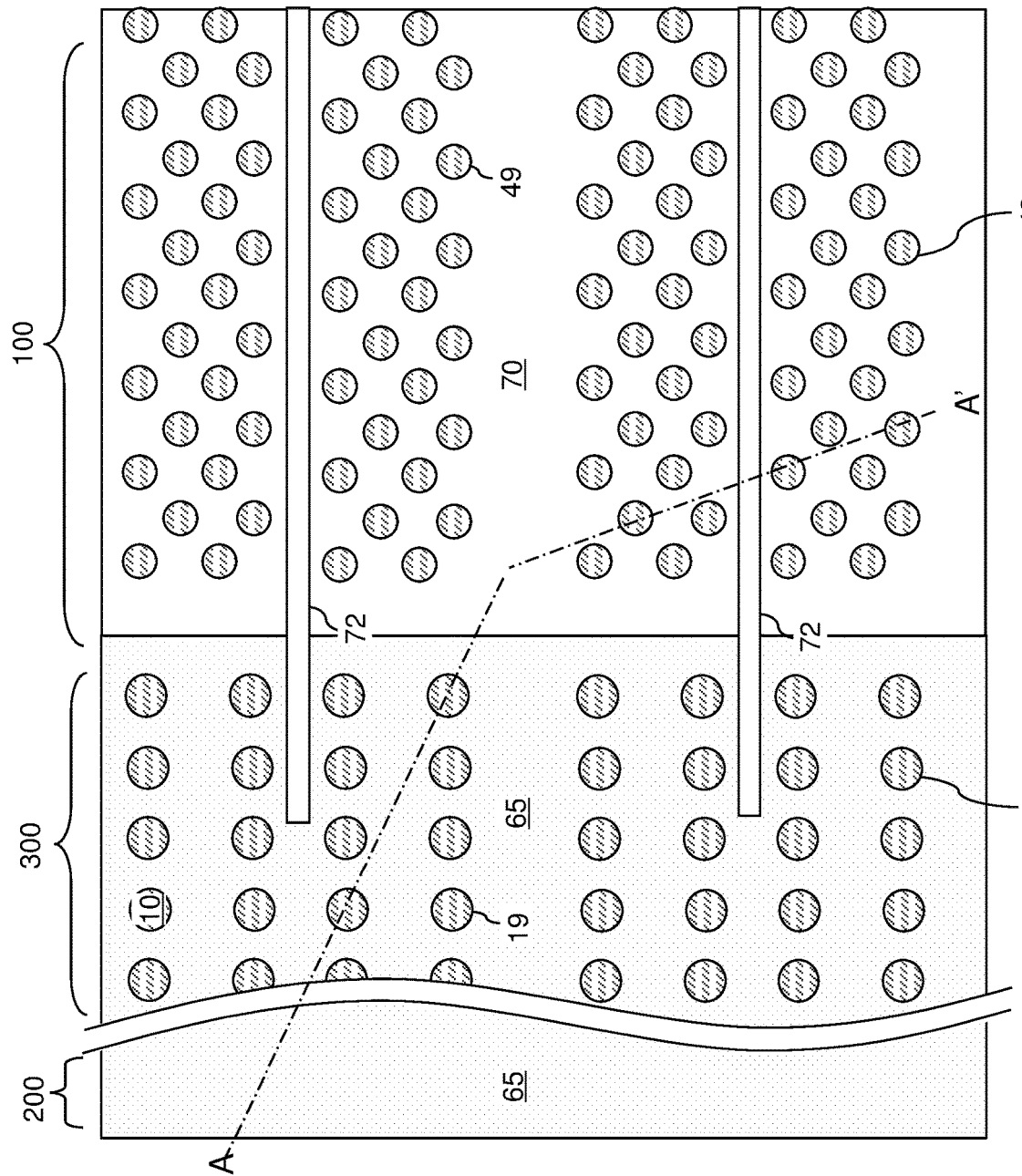
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the vertical repetition (32, 42) by at least one anisotropic etch that employs the patterned lithographic material stack as an etch mask. Portions of the vertical repetition (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the vertical repetition (32, 42) in the memory array region 100. The support openings 19 are formed through the retro-stepped dielectric material portion 65 and the portion of the vertical repetition (32, 42) that underlie the stepped surfaces in the contact region 300. Preferably, the layers of the vertical repetition (32, 42) have the same or similar anisotropic etch rates.

The memory openings 49 extend through the entirety of the vertical repetition (32, 42). The support openings 19 extend through a subset of layers within the vertical repetition (32, 42). The chemistry of the anisotropic etch process employed to etch through the materials of the vertical repetition (32, 42) can alternate to optimize etching of the first and second materials in the vertical repetition (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the vertical repetition (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the vertical repetition (32, 42), and optionally into an upper portion of the semiconductor material layer 10. At this processing step, each support opening 19 can extend through the retro-stepped dielectric material portion 65, a subset of layers in the vertical repetition (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including an optional blocking dielectric layer 52, a memory material layer 54, a dielectric material liner 56, and an optional sacrificial cover material layer 601 can be sequentially deposited in the memory openings 49 by a respective conformal deposition process.

The optional blocking dielectric layer 52 can include a single dielectric material layer or a stack of a plurality of dielectric material layers. The blocking dielectric layer 52 can be formed employing a conformal deposition process. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be deposited as a continuous material layer by a conformal deposition process such as a chemical vapor deposition process or an atomic layer deposition process. The memory material layer 54 includes a memory material, i.e., a material that can store data by selecting a state of the material. For example, the memory material layer 54 may include a charge storage material such as silicon nitride, polysilicon, or a metallic material, a ferroelectric material that can store information in the form of a polarization direction, or any other memory material that can store date by altering electrical resistivity properties.

The memory material layer 54 can be formed as a single memory material layer of homogeneous composition, or can include a stack of multiple memory material layers. In one embodiment, the memory material layer 54 may comprise an insulating charge trapping material, such as one or more silicon nitride segments. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The dielectric material liner 56 includes a dielectric material. The dielectric material liner 56 can be formed on the memory material layer 54 employing a conformal deposition process. In one embodiment, the dielectric material liner 56 comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the three-dimensional NAND string memory device to be formed. The dielectric material liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 can include a stack of a first silicon oxide layer, a silicon oxynitride layer, and a second silicon oxide layer, which is commonly known as an ONO stack. In one embodiment, the dielectric material liner 56 can include a silicon oxide layer that is substantially free of carbon or a silicon oxynitride layer that is substantially free of carbon. The thickness of the dielectric material liner 56 can be in a range from 2 nm to 20 nm, although lesser and greater thicknesses can also be employed.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional sacrificial cover material layer 601, the dielectric material liner 56, the memory material layer 54, and the blocking dielectric layer 52 overlying the insulating cap layer 70 are sequentially anisotropically etched employing at least one anisotropic etch process. The portions of the sacrificial cover material layer 601, the dielectric material liner 56, the memory material layer 54, and the blocking dielectric layer 52 located above the top surface of the insulating cap layer 70 can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material, a ferroelectric material, a resistive memory material that can provide at least two different levels of resistivity (such as a phase change material or a metal oxide material), or any other memory material that can store information by a change in state. In one embodiment, each memory material layer 54 can include a vertical stack of charge storage regions that store electrical charges upon programming In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the dielectric material liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A dielectric material liner 56 is located over the memory material layer 54. A set of a blocking dielectric layer 52, a memory material layer 54, and a dielectric material liner 56 in a memory opening 49 constitutes a memory film 50, which includes a plurality of charge storage regions (comprising portions of the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls. The sacrificial cover material layer 601 can be subsequently removed selective to the material of the dielectric material liner 56. In case the sacrificial cover material layer 601 includes a semiconductor material, it may be retained in the device or removed using a wet etch process employing hot trimethyl-2 hydroxyethyl ammonium hydroxide ("hot TMY") or tetramethyl ammonium hydroxide (TMAH).

Referring to FIG. 5E, a semiconductor channel layer 60C can be deposited directly on the semiconductor surface of the pedestal channel portion 11 or the semiconductor material layer 10 if the pedestal channel portion 11 is omitted, and directly on the dielectric material liner 56. The semiconductor channel layer 60C includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60C includes amorphous silicon or polysilicon. The semiconductor channel layer 60C can be intrinsic or have a doping of a first conductivity type, which is the same as the conductivity type of the semiconductor material layer 10 and the pedestal channel portions 11. The semiconductor channel layer 60C can be formed by a conformal deposition method such as low pressure chemical vapor deposition (LPCVD). The thickness of the semiconductor channel layer 60C can be in a range from 2 nm to 10 nm, although lesser and greater thicknesses can also be employed. The semiconductor channel layer 60C may partially fill the memory cavity 49' in each memory opening, or may fully fill the cavity in each memory opening.

Referring to FIG. 5F, in case the memory cavity 49' in each memory opening is not completely filled by the semiconductor channel layer 60C, a dielectric core layer 62C can be deposited in the memory cavity 49' to fill any remaining portion of the memory cavity 49' within each memory opening. The dielectric core layer 62C includes a dielectric material such as silicon oxide or organosilicate glass. The dielectric core layer 62C can be deposited by a conformal deposition method such as low pressure chemical vapor deposition (LPCVD), or by a self-planarizing deposition process such as spin coating.

Figure 5H:
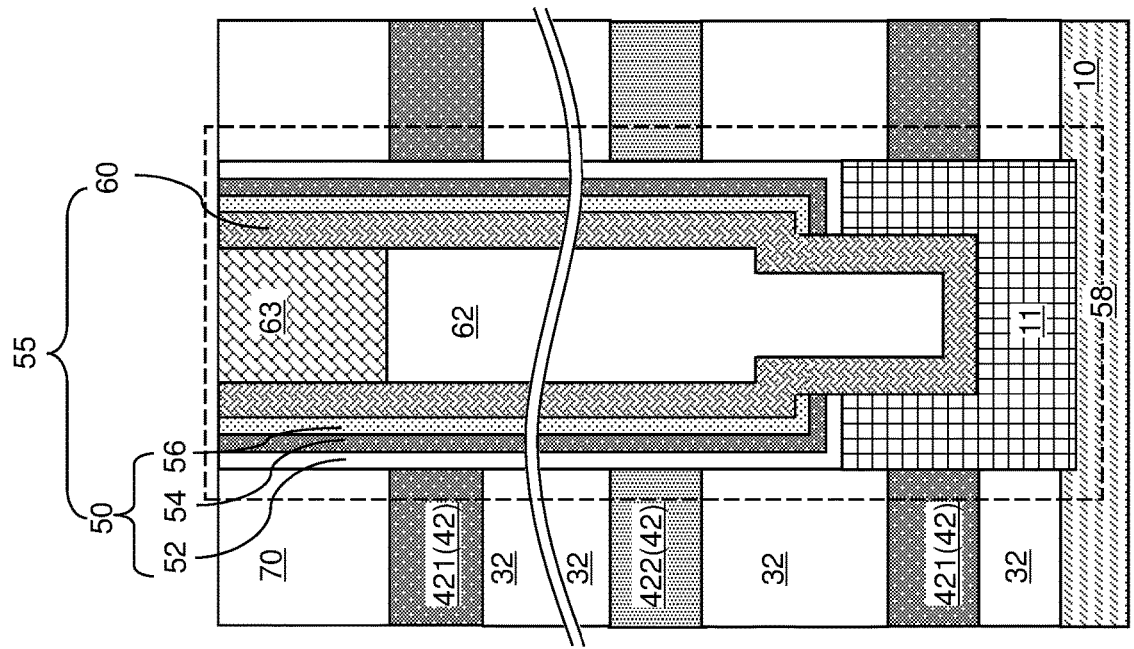
Figure 5G:
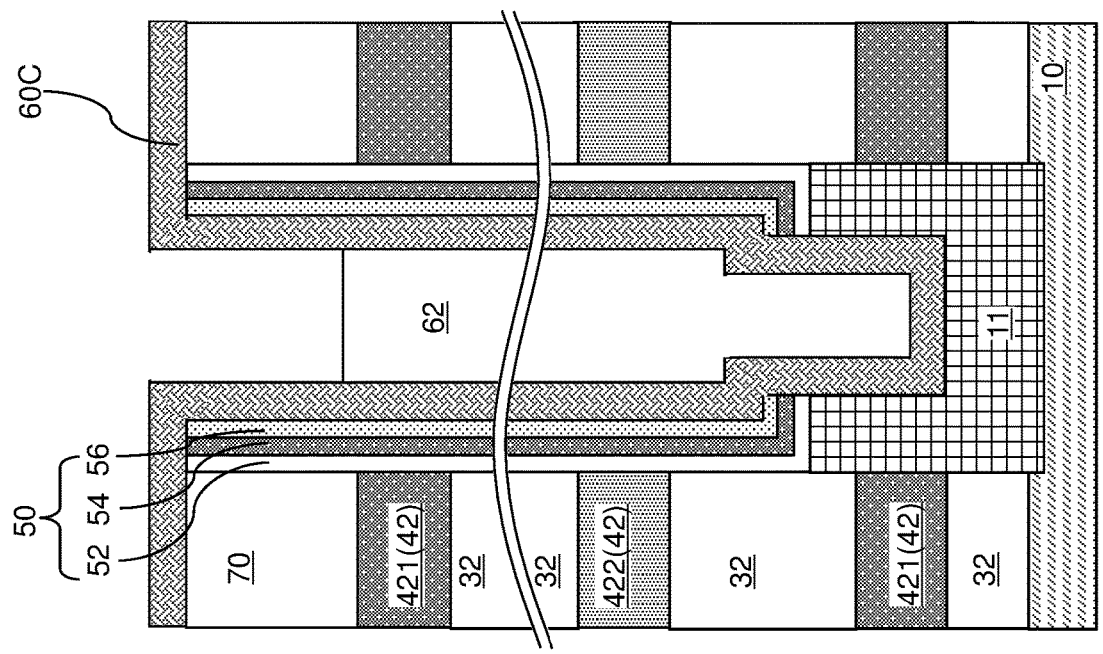

Referring to FIG. 5G, the horizontal portion of the dielectric core layer 62C can be removed, for example, by a recess etch process such that each remaining portions of the dielectric core layer 62C is located within a respective memory opening 49 and has a respective top surface below the horizontal plane including the top surface of the insulating cap layer 70. Each remaining portion of the dielectric core layer 62C constitutes a dielectric core 62.

Referring to FIG. 5H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon. Excess portions of the deposited semiconductor material having a doping of the second conductivity type and a horizontal portion of the semiconductor channel layer 60C can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60C (which has a doping of the first conductivity type) constitutes a vertical semiconductor channel 60. The vertical semiconductor channel 60 is formed directly on the dielectric material liner 56.

A dielectric material liner 56 is surrounded by a memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or ferroelectric polarization with a macroscopic retention time. In some embodiments, a blocking dielectric layer 52 may not be present in the memory film 50 at this step, and a backside blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a dielectric material liner, a plurality of memory elements comprising portions of the memory material layer 54, and an optional blocking dielectric layer 52. An entire set of material portions that fills a memory opening 49 is herein referred to as a memory opening fill structure 58. An entire set of material portions that fills a support opening 19 constitutes a support pillar structure.

Generally, a memory opening fill structure 58 can be formed in each memory opening 49. The memory opening fill structure 58 comprises an optional blocking dielectric layer 52, a memory material layer 54, an optional dielectric material liner 56, and a vertical semiconductor channel 60.

The dielectric material liner 56 may laterally surround the vertical semiconductor channel 60. The memory material layer 54 can laterally surround the dielectric material liner 56.

Figure 6:
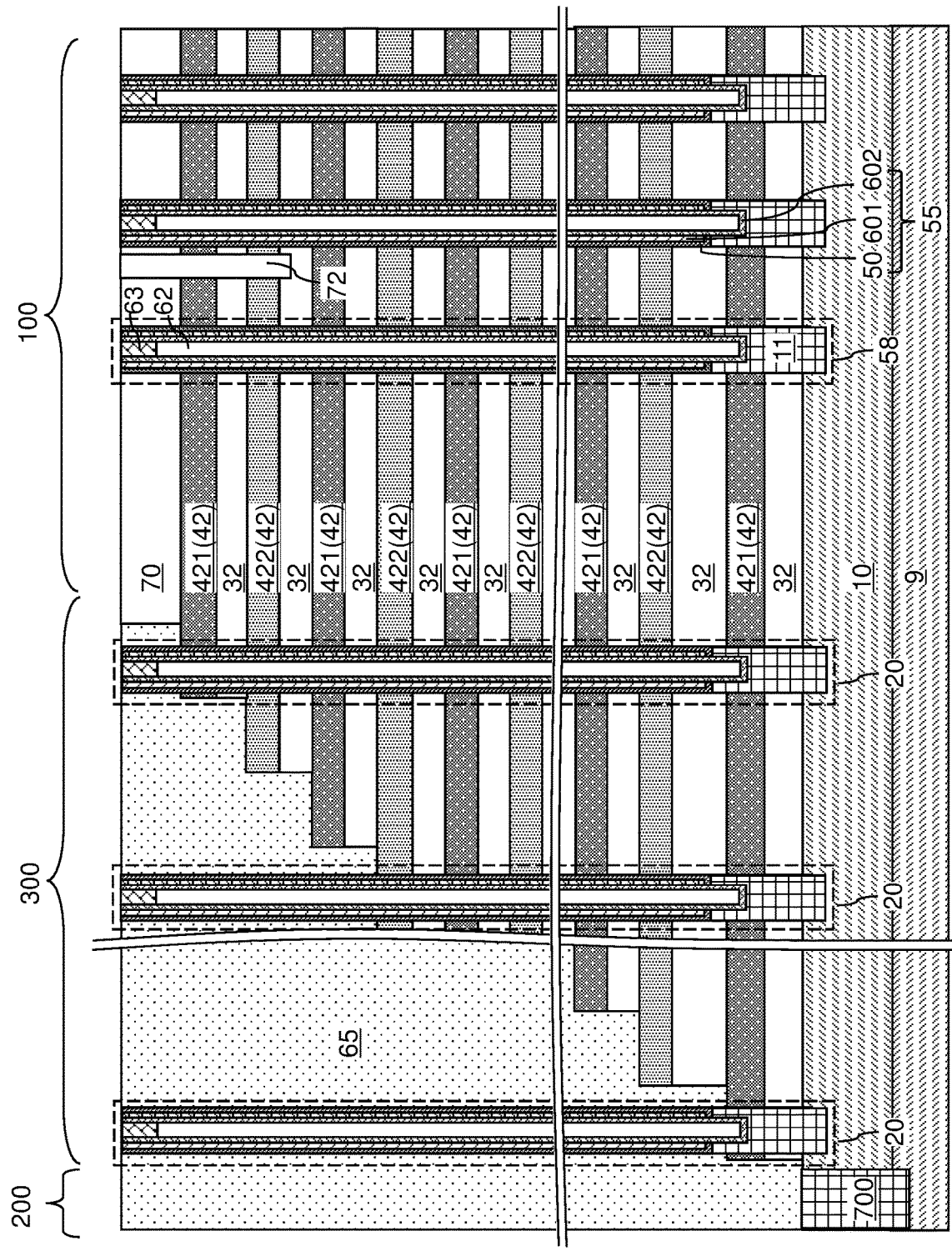
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a dielectric material liner 56 laterally surrounding the vertical semiconductor channel 60, a vertical stack of charge storage regions (e.g., comprising portions of the memory material layer 54) laterally surrounding the dielectric material liner 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
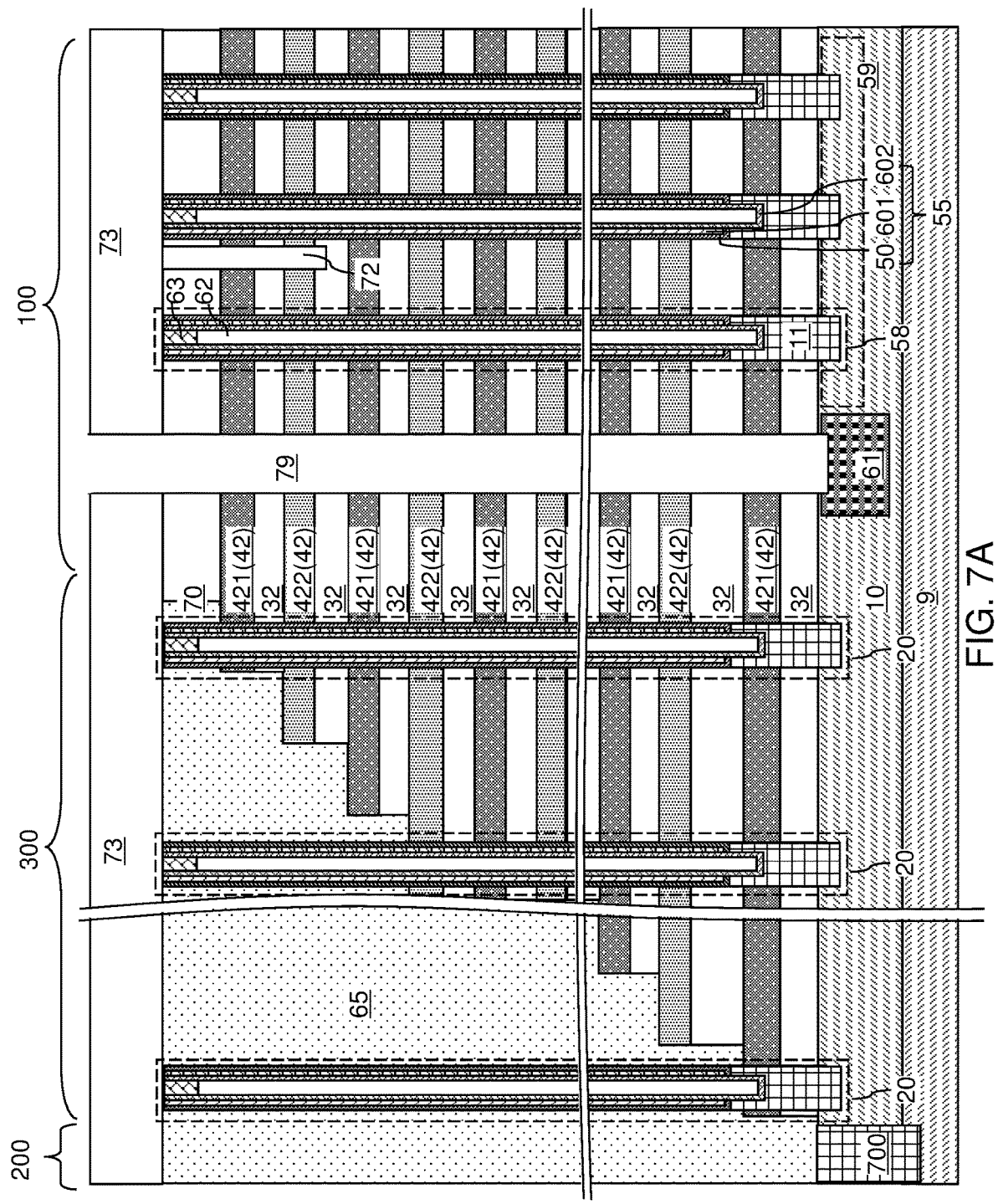
FIG. 7A is a schematic vertical cross-sectional view of the exemplary structure after formation of backside trenches according to an embodiment of the present disclosure.
Figure 7B:
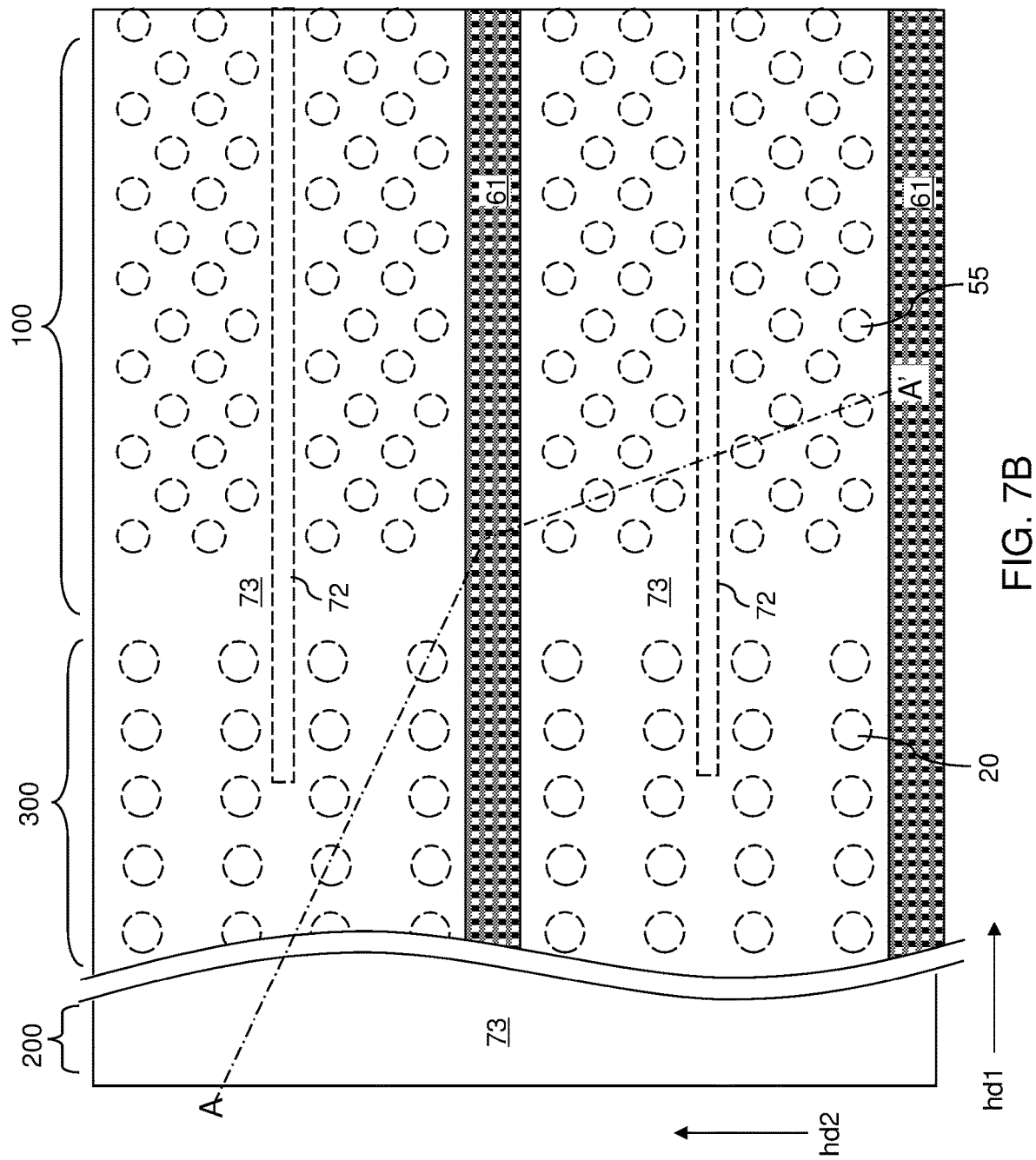
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact-level dielectric layer 73 can be formed over the layer stack (32, 42, 70) including the vertically repetition (32, 421, 32, 422), an optional partial layer set, and the insulating cap layer 70. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73, the layer stack (32, 42, 70) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction (e.g., word line direction) hd1 and can be laterally spaced apart from each other along a second horizontal direction (e.g., bit line direction) hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-selectlevel isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing. Generally, backside trenches 79 laterally extending along the first horizontal direction hd1 can be formed through the contact-level dielectric layer 73 and the layer stack (32, 42, 70). The layer stack (32, 42, 70, 73) including the vertically repetition (32, 421, 32, 422), an optional partial layer set, the insulating cap layer 70, and the contact-level dielectric layer 73 is divided into multiple layer stacks (32, 42, 70, 73) that are laterally spaced apart along the second horizontal direction hd2 by the backside trenches 79.

Dopants of the second conductivity type can be implanted into physically exposed surface portions of the substrate (9, 10) (which may be surface portions of the semiconductor material layer 10) that are located at the bottom of the backside trenches by an ion implantation process. A source region 61 can be formed at a surface portion of the semiconductor material layer 10 under each backside trench 79. Each source region 61 is formed in a surface portion of the substrate (9, 10) that underlies a respective backside trench 79. Due to the straggle of the implanted dopant atoms during the implantation process and lateral diffusion of the implanted dopant atoms during a subsequent activation anneal process, each source region 61 can have a lateral extent greater than the lateral extent of the lateral extent of the overlying backside trench 79.

An upper portion of the semiconductor material layer 10 that extends between the source region 61 and the plurality of pedestal channel portions 11 constitutes a horizontal semiconductor channel 59 for a plurality of vertical NAND strings. The horizontal semiconductor channel 59 is connected to multiple vertical semiconductor channels 60 through respective pedestal channel portions 11. Each horizontal semiconductor channel 59 contacts a source region 61 and a plurality of pedestal channel portions 11. Alternatively, a horizontal semiconductor source strap (e.g., direct strap contact) may be formed in contact with a sidewall of the vertical semiconductor channel 60 in place of the source region 61 and the horizontal semiconductor channel 59.

Figure 8:
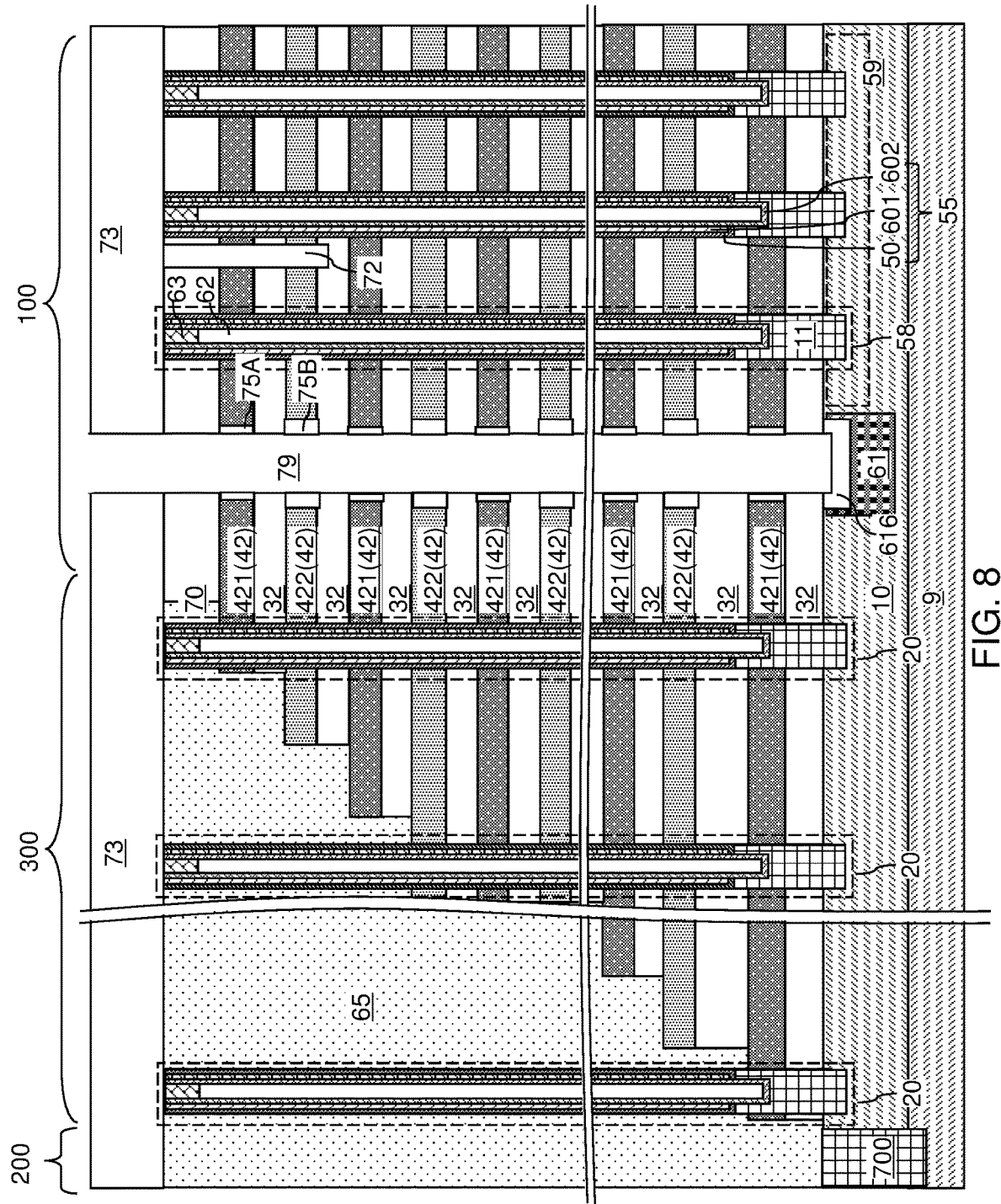
FIG. 8 is a schematic vertical cross-sectional view of the exemplary structure after formation of silicon oxide plates according to an embodiment of the present disclosure.

Referring to FIG. 8, an oxidation process can be performed to convert surfaces portions of the first sacrificial material layers 421, the second sacrificial material layers 422, and optionally the source regions 61 to an oxide material. The surface portions of the first sacrificial material layers 421 that are physically exposed to the backside trenches 79 are converted into first silicon oxide plates 75A, which include a first silicon oxide material converted from the material of the first sacrificial material layers 421 by the oxidation process. The surface portions of the second sacrificial material layers 422 that are physically exposed to the backside trenches 79 are converted into second silicon oxide plates 75B, which include a second silicon oxide material converted from the material of the second sacrificial material layers 422 by the oxidation process. The surface portions of the source regions 61 are converted into planar dielectric portions 616, which include a silicon oxide material including dopants of the second conductivity type. Each of the first silicon oxide plates 75A and the second silicon oxide plates 75B may laterally extend along the first horizontal direction hd1 with a respective pair of straight lengthwise sidewalls having a respective uniform lateral separation distance, which is the lateral thickness of a respective silicon oxide plate (75A, 75B).

As discussed above, the first sacrificial material and the second sacrificial material are selected such that the second sacrificial material has a higher oxidation rate than the first sacrificial material. The ratio of the second oxidation rate to the first oxidation rate may be in a range from 1.5 to 10, such as from 2 to 5. Thus, the second silicon oxide plates 75B have a greater lateral thickness than the first silicon oxide plates 75A. In an illustrative example, the second silicon oxide plates 75B may have a thickness in a range from 5 nm to 100 nm, such as from 10 nm to 40 nm, although lesser and greater thicknesses may also be employed. The first silicon oxide plate 75A may have a thickness in a range from 2.5 nm to 50 nm, such as from 5 nm to 20 nm, although lesser and greater thicknesses may also be employed. The thickness of the planar dielectric portions 616 may be in a range from 5 nm to 100 nm, such as from 10 nm to 40 nm, although lesser and greater thicknesses may also be employed.

Figure 9:
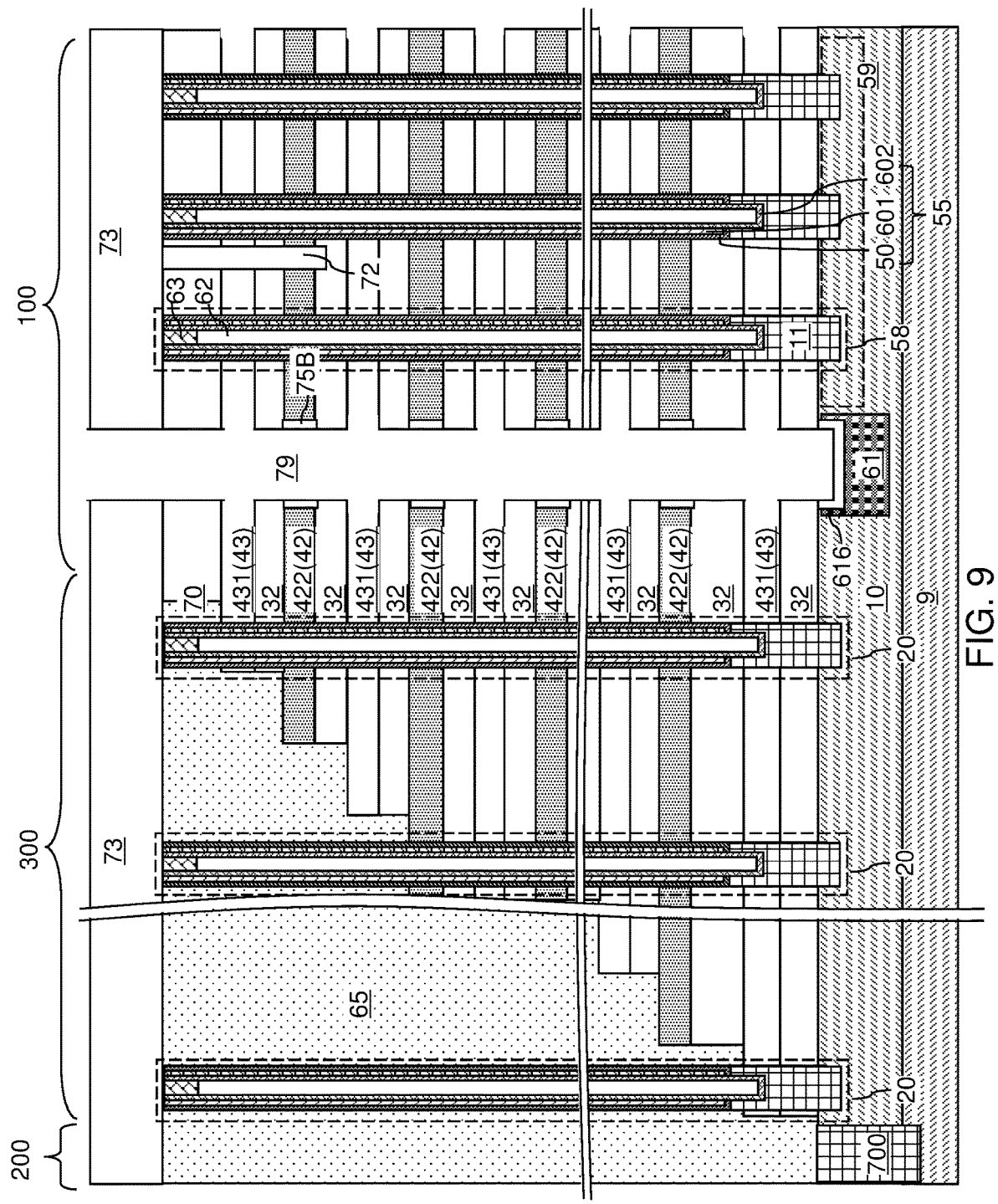
FIG. 9 is a schematic vertical cross-sectional view of the exemplary structure after formation of first backside recesses according to an embodiment of the present disclosure.

Referring to FIG. 9, a first silicon oxide recess etch process can be performed to recess the first and second silicon oxide plates (75A, 75B). The etch process may be an isotropic or an anisotropic etch process. The planar dielectric portions 616 may be collaterally partially etched by the first silicon oxide isotropic recess etch process. For example, the first silicon oxide recess etch process may comprise a first wet etch process employing dilute hydrofluoric acid. The dilution of the etchant and the duration of the first silicon oxide recess etch process may be selected such that the entirety of the first silicon oxide plates 75A is removed while each of the second silicon oxide plates 75B is only partially removed. Thus, sidewalls of the first sacrificial material layers 421 can be physically exposed to the backside trench 79, while each of the second sacrificial material layers 422 is covered with remaining portions of the second silicon oxide plates 75B, which have a lateral thickness that is less than the original lateral thickness as formed at the processing steps of FIG. 8.

A first isotropic etch process can be performed, in which an etchant that selectively etches the material of the first sacrificial material layers 421 with respect to the materials of the insulating layers 32 and the second silicon oxide plates 75B is introduced into the backside cavities 79'. First backside recesses 431 (which is a subset of backside recesses 43 that are formed during a manufacturing sequence of the embodiments of the present disclosure) are formed in volumes from which the first sacrificial material layers 421 are removed. The removal of the first sacrificial material of the first sacrificial material layers 421 can be selective to the material of the insulating layers 32, the material of the second silicon oxide plates 75B, the material of the retro-stepped dielectric material portion 65, the material of the planar dielectric portions 616, and the material of the outermost layer of the memory films 50 (such as the blocking dielectric layer 52). In one embodiment, the first sacrificial material layers 421 can include a first silicon nitride material or a semiconductor material, and the materials of the insulating layers 32 and the retro-stepped dielectric material portion 65 can be selected from silicon oxide and dielectric metal oxides.

The first isotropic etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the first sacrificial material layers 421 include silicon nitride, the etch process can be a wet etch process in which the exemplary structure is immersed within a wet etch tank including phosphoric acid, which etches silicon nitride selective to silicon oxide, silicon, and various other materials employed in the art. If the first sacrificial material layers 421 include silicon germanium, the etch process can be a wet etch process in which the exemplary structure is immersed within a wet etch tank including a mixture of dilute hydrofluoric acid and hydrogen peroxide, which etches a silicon germanium alloy selective to silicon oxide. If the first sacrificial material layers 421 include silicon (e.g., amorphous silicon or polysilicon), then hot trimethyl-2 hydroxyethyl ammonium hydroxide ("hot TMY") or tetramethyl ammonium hydroxide (TMAH) etch may be used.

The support pillar structure 20, the retro-stepped dielectric material portion 65, and the memory stack structures 55 provide structural support while the first backside recesses 431 are present within volumes previously occupied by the first sacrificial material layers 421. Since the second sacrificial material layers 422 are protected by the plates 75B, the second sacrificial material layers 422 are noted etched and remain in the alternating stack. Therefore, the second sacrificial material layers 422 provide additional support to the alternating stack, and prevent or reduce insulating layer 32 buckling and pattern collapse into the first backside recesses 431. Furthermore, if both sacrificial material layers (421, 422) comprise silicon nitride then only part of the silicon nitride sacrificial material layers 42 are removed. This reduces the amount of silica precipitation in the backside recesses 79. The reduced silica precipitation reduces the likelihood that the first backside recesses 431 would be blocked by the silica precipitates, and thus reduces the likelihood of voids in the word lines formed in the backside recesses 431.

Each first backside recess 431 can be a laterally extending cavity having a lateral dimension that is greater than the vertical extent of the cavity. In other words, the lateral dimension of each first backside recess 431 can be greater than the height of the backside recess 43. A plurality of first backside recesses 431 can be formed in the volumes from which the first sacrificial material of the first sacrificial material layers 421 is removed. The memory openings in which the memory stack structures 55 are formed are herein referred to as front side openings or front side cavities in contrast with the first backside recesses 431. In one embodiment, the memory array region 100 comprises an array of three-dimensional NAND strings having a plurality of device levels disposed above the substrate (9, 10). In this case, each first backside recess 431 can define a space for receiving a respective word line of the array of three-dimensional NAND strings.

Each of the plurality of first backside recesses 431 can extend substantially parallel to the top surface of the substrate (9, 10). A first backside recess 431 can be vertically bounded by a top surface of an underlying insulating layer 32 and a bottom surface of an overlying insulating layer 32. In one embodiment, each first backside recess 431 can have a uniform height throughout.

Figure 10A:
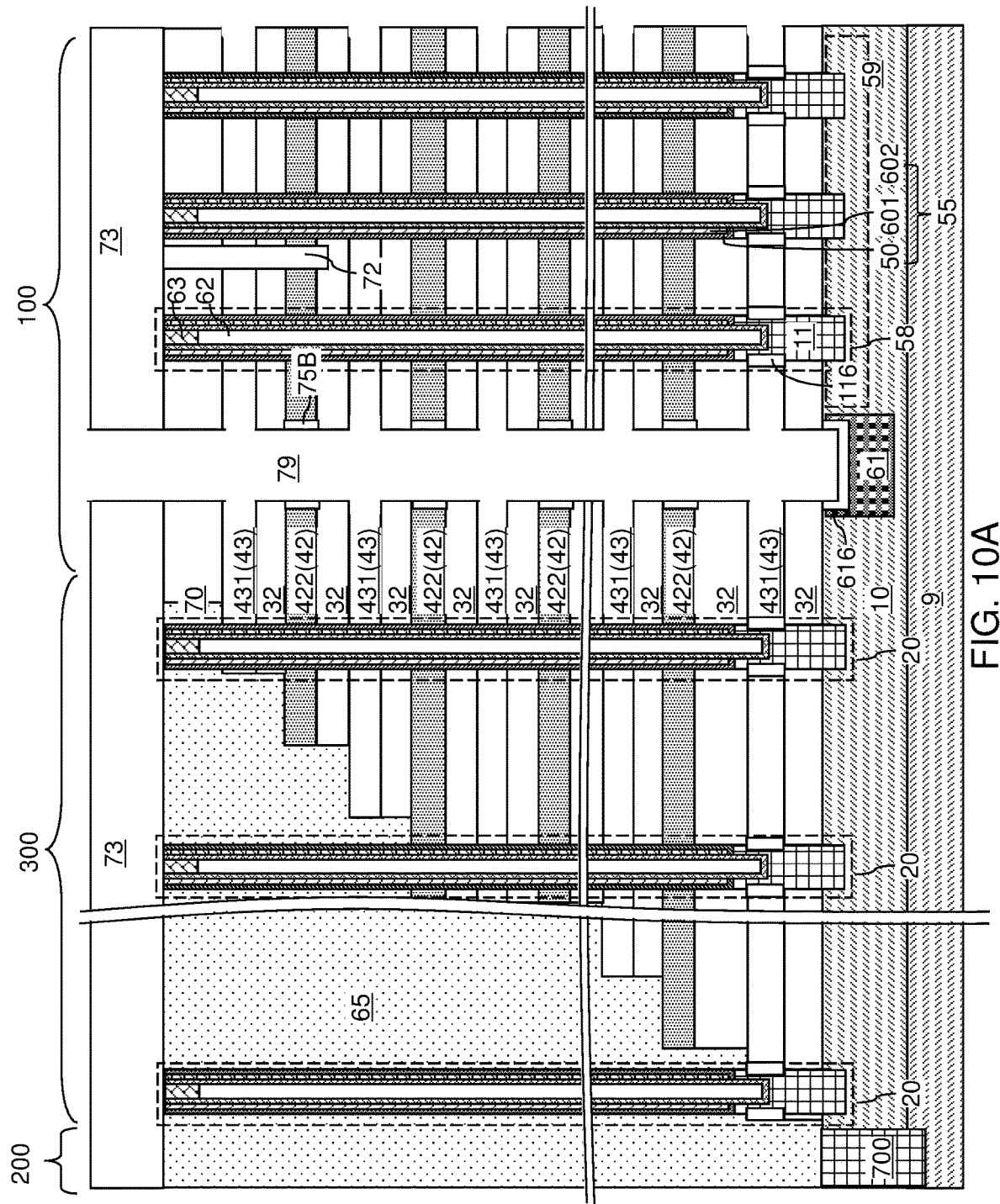
FIG. 10A is a schematic vertical cross-sectional view of the exemplary structure after formation of tubular dielectric spacers and planar dielectric portions according to an embodiment of the present disclosure.
Figure 10B:
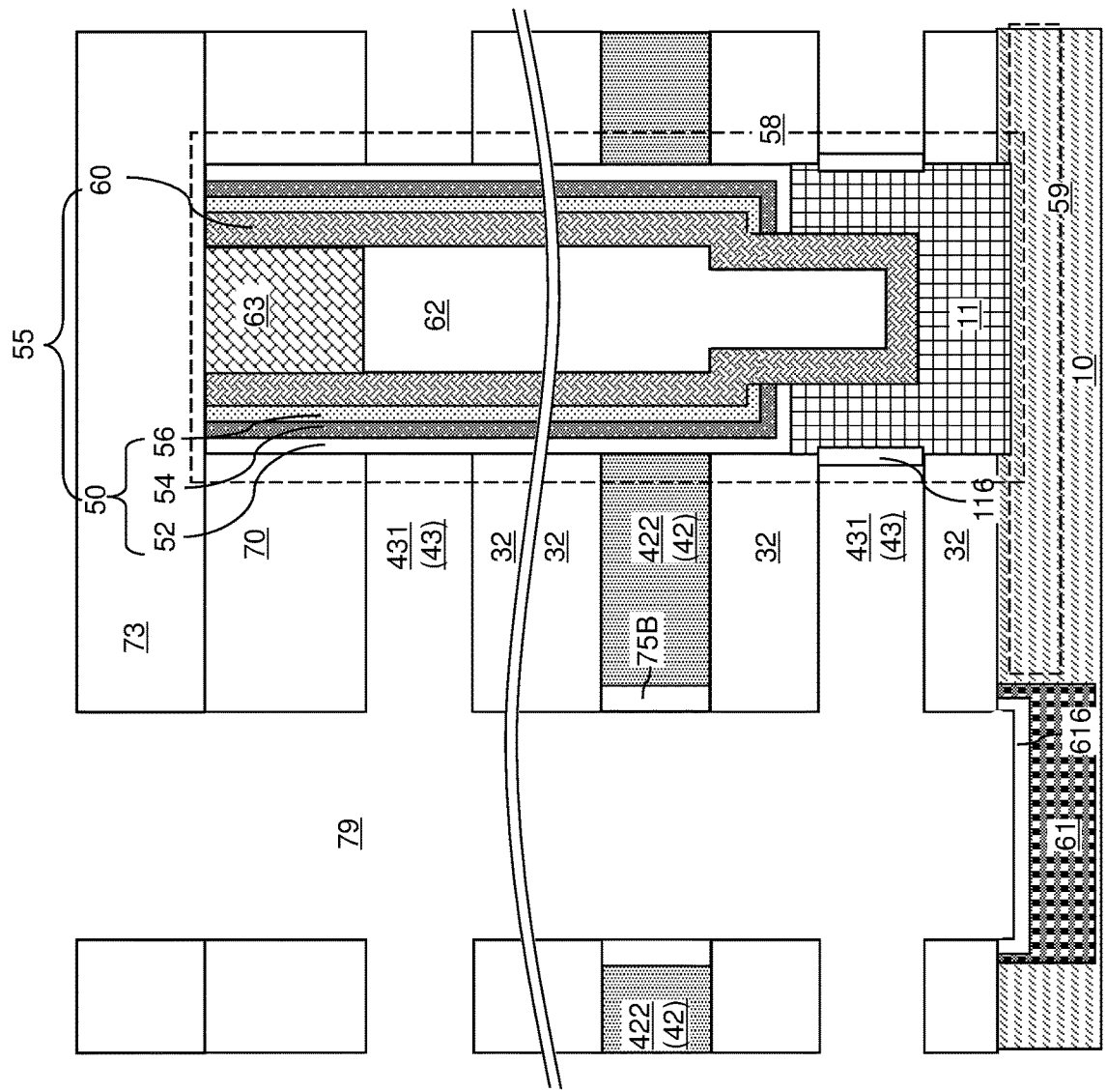
FIG. 10B is a magnified view of a region of the exemplary structure of FIG. 10A.

Referring to FIGS. 10A and 10B, physically exposed surface portions of the optional pedestal channel portions 11 can be converted into dielectric material portions by thermal conversion and/or plasma conversion of the semiconductor material of the pedestal channel portions 11 into dielectric materials. For example, thermal conversion and/or plasma conversion can be employed to convert a surface portion of each pedestal channel portion 11 into a tubular dielectric spacer 116. The thermal and/or plasma conversion process may thicken the planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11.

Figure 11A:
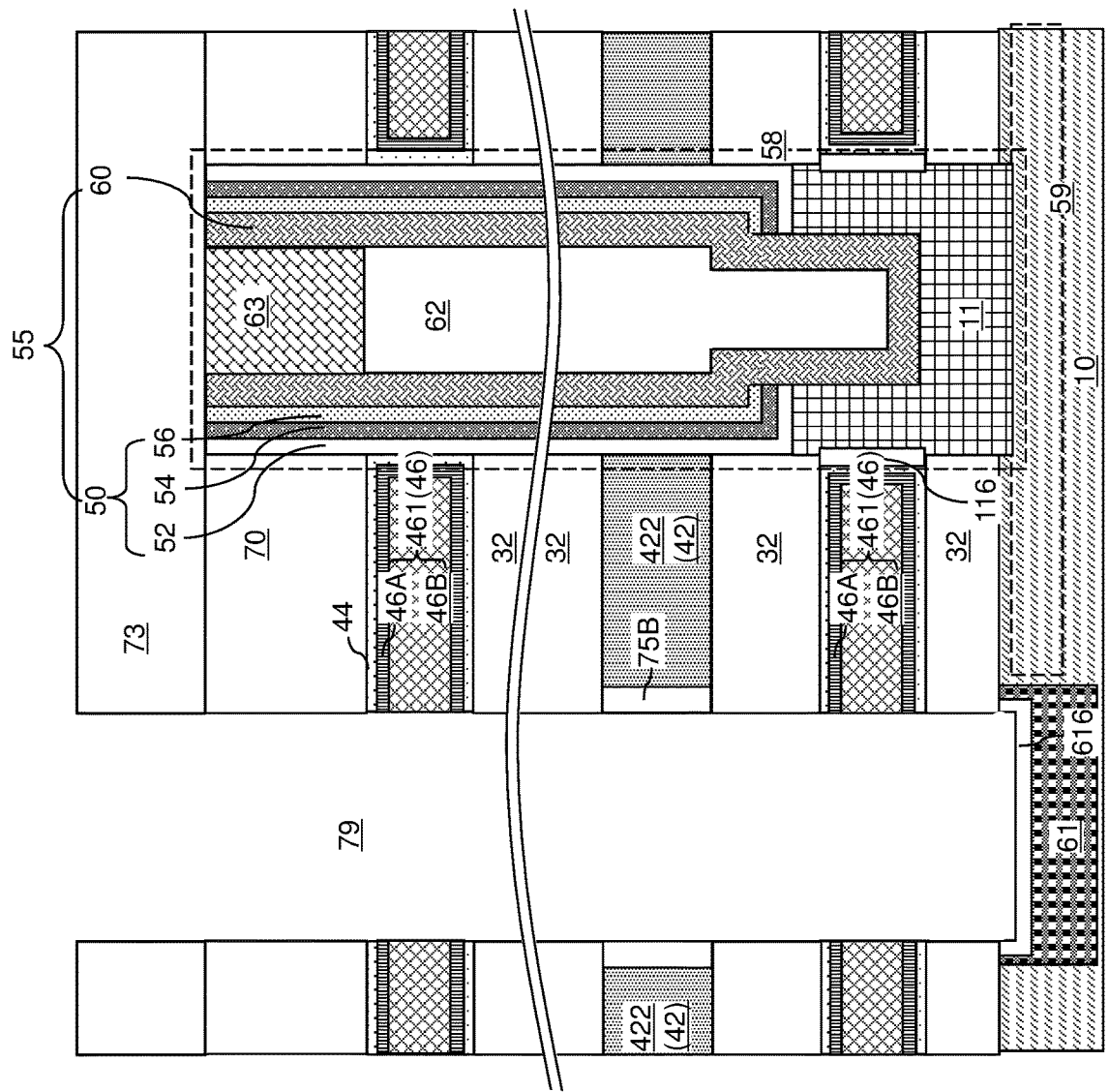
FIGS. 11A-11E are sequential vertical cross-sectional views of a region of the exemplary structure during formation of first electrically conductive layers and second backside recesses according to an embodiment of the present disclosure.

Referring to FIG. 11A, a first backside blocking dielectric layer 44 can be optionally formed by a conformal deposition process. The first backside blocking dielectric layer 44, if present, comprises a dielectric material that functions as a control gate dielectric for the control gates to be subsequently formed in the first backside recesses 431. In case the blocking dielectric layer 52 is present within each memory opening, the first backside blocking dielectric layer 44 is optional. In case the blocking dielectric layer 52 is omitted, the first backside blocking dielectric layer 44 is present.

The first backside blocking dielectric layer 44 can be formed in the first backside recesses 431 and on the sidewalls of the backside trenches 79. The first backside blocking dielectric layer 44 can be formed directly on horizontal surfaces of the insulating layers 32 and sidewalls of the memory stack structures 55 within the first backside recesses 431. If the first backside blocking dielectric layer 44 is formed, formation of the tubular dielectric spacers 116 prior to formation of the first backside blocking dielectric layer 44 is optional. In one embodiment, the first backside blocking dielectric layer 44 can be formed by a conformal deposition process such as atomic layer deposition (ALD). The first backside blocking dielectric layer 44 can consist essentially of aluminum oxide. The thickness of the first backside blocking dielectric layer 44 can be in a range from 1 nm to 15 nm, such as 2 to 6 nm, although lesser and greater thicknesses can also be employed.

The dielectric material of the first backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the first backside blocking dielectric layer 44 can include a silicon oxide layer. The first backside blocking dielectric layer 44 can be deposited by a conformal deposition method such as chemical vapor deposition or atomic layer deposition. The first backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the first backside recesses 431, and a top surface of the planar dielectric portion 616. A backside cavity 79' is present within the portion of each backside trench 79 that is not filled with the first backside blocking dielectric layer 44.

At least one first electrically conductive material can be deposited in the remaining volumes of the first backside recesses 431. For example, a metallic barrier layer 46A can be deposited in the first backside recesses 431. The metallic barrier layer 46A includes an first electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material can be deposited in the plurality of backside recesses 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of first electrically conductive layers 461 can be formed in the plurality of first backside recesses 431, and a continuous metallic material layer (which is a temporary structure and is not illustrated) can be formed on the sidewalls of each backside trench 79 and over the contact-level dielectric layer 73. The first electrically conductive layers 461 is a first subset of electrically conductive layers 46 that are formed during the manufacturing sequence of the present disclosure. Each first electrically conductive layer 461 includes a portion of the metallic barrier layer 46A and a portion of the metallic fill material layer 46B that are located between a vertically neighboring pair of insulating material layers such as a vertically neighboring pair of insulating layers 32. Each first sacrificial material layer 421 can be replaced with a first electrically conductive layer 461. A backside cavity is present in each backside trench 79 that is not filled with the continuous metallic material layer.

The continuous first electrically conductive material layer is etched back from the sidewalls of each backside trench 79 and from above the contact-level dielectric layer 73, for example, by an isotropic wet etch, an anisotropic dry etch, or a combination thereof. Each remaining portion of the deposited metallic material in the first backside recesses 431 constitutes a first electrically conductive layer 461. Each first electrically conductive layer 461 can be a conductive line structure.

Each first electrically conductive layer 461 can function as a combination of a plurality of control gate electrodes located at a same level and a word line electrically interconnecting, i.e., electrically shorting, the plurality of control gate electrodes located at the same level. The plurality of control gate electrodes within each first electrically conductive layer 461 are the control gate electrodes for the vertical memory devices including the memory stack structures 55. In other words, each first electrically conductive layer 461 can be a word line that functions as a common control gate electrode for the plurality of vertical memory devices. The planar dielectric portions 616 can be removed during removal of the continuous first electrically conductive material layer. A backside cavity 79' is present within each backside trench 79.

Figure 11B:
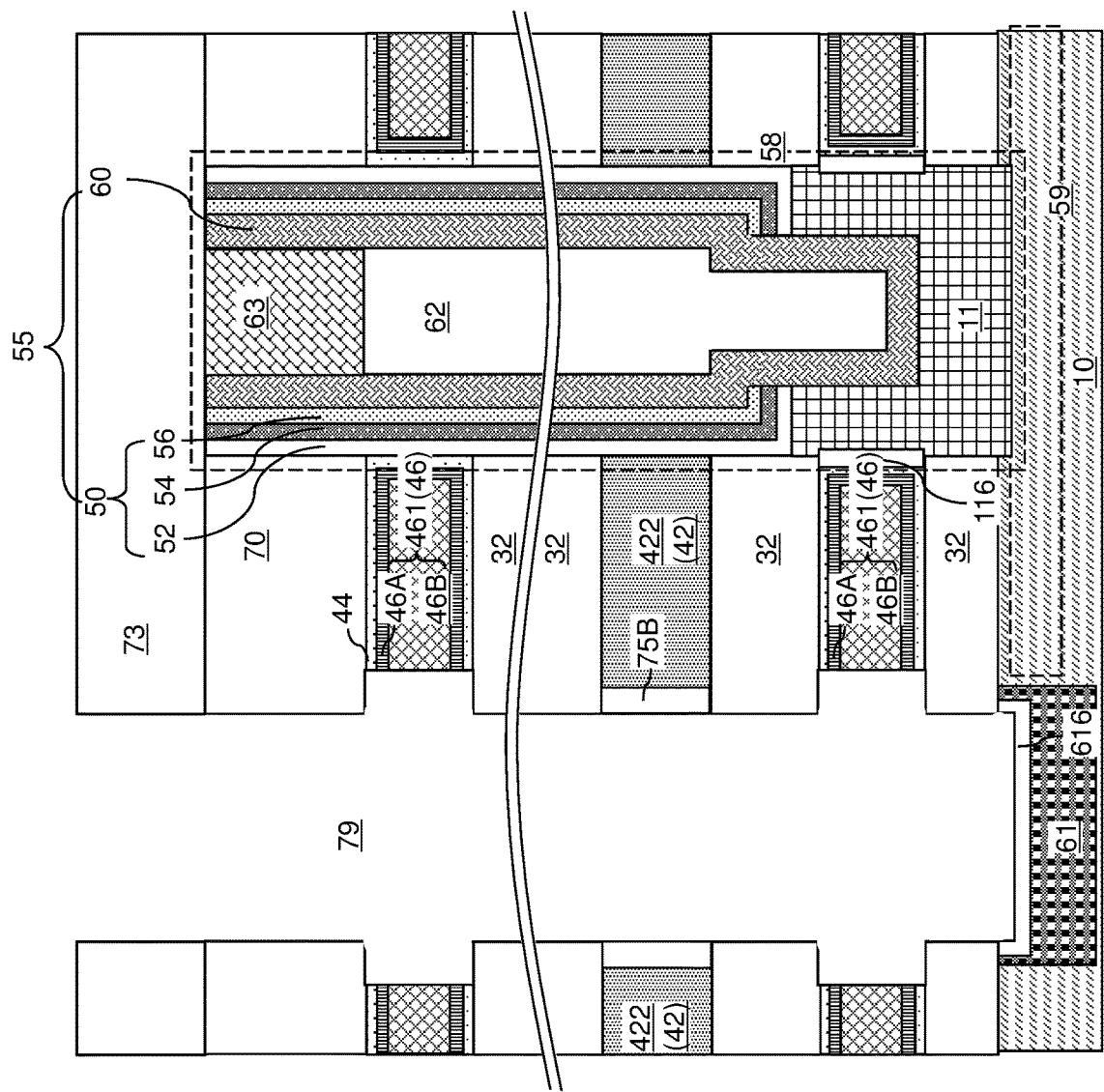

Referring to FIG. 11B and according to an aspect of the present disclosure, physically exposed sidewalls of the first electrically conductive layers 461 can be laterally recessed by performing a first isotropic metal etch process that etches the materials of the first electrically conductive layers 46 selective to the materials of the insulating layers 32 and the insulating cap layer 70. For example, a wet etch process that etches metallic materials of the first electrically conductive layers 461 selective to silicon oxide may be performed. The duration of the first isotropic metal etch process can be selected such that the lateral recess distance for the sidewalls of the first electrically conductive layers 461 is greater than the lateral thickness of the second silicon oxide plates 75B. For example, the lateral thickness of the second silicon oxide plates 75B at this processing step may be in a range from 2.5 nm to 50 nm, such as from 5 nm to 20 nm, although lesser and greater thicknesses may also be employed. The lateral recess distance for the first electrically conductive layers 461 may be in a range from 5 nm to 200 nm, such as from 10 nm to 100 nm and/or from 20 nm to 50 nm, although lesser and greater lateral recess distances may also be employed. Generally, the first electrically conductive layers 461 are laterally recessed relative to vertical planes including sidewalls of the insulating layers 32 around each backside trench 79 by a lateral recess distance that is greater than the lateral thickness of each of the remaining portions of the second silicon oxide plates 75B. Optionally, portions of the first backside blocking dielectric layer 44 may be collaterally removed concurrently with lateral recessing of the first electrically conductive layers 461. Backside lateral recesses are formed at levels of the first electrically conductive layers 461 around the backside trench. The backside lateral recesses include volumes from which the materials of the first electrically conductive layers 461 and the first backside blocking dielectric layers 44 are removed.

Figure 11C:
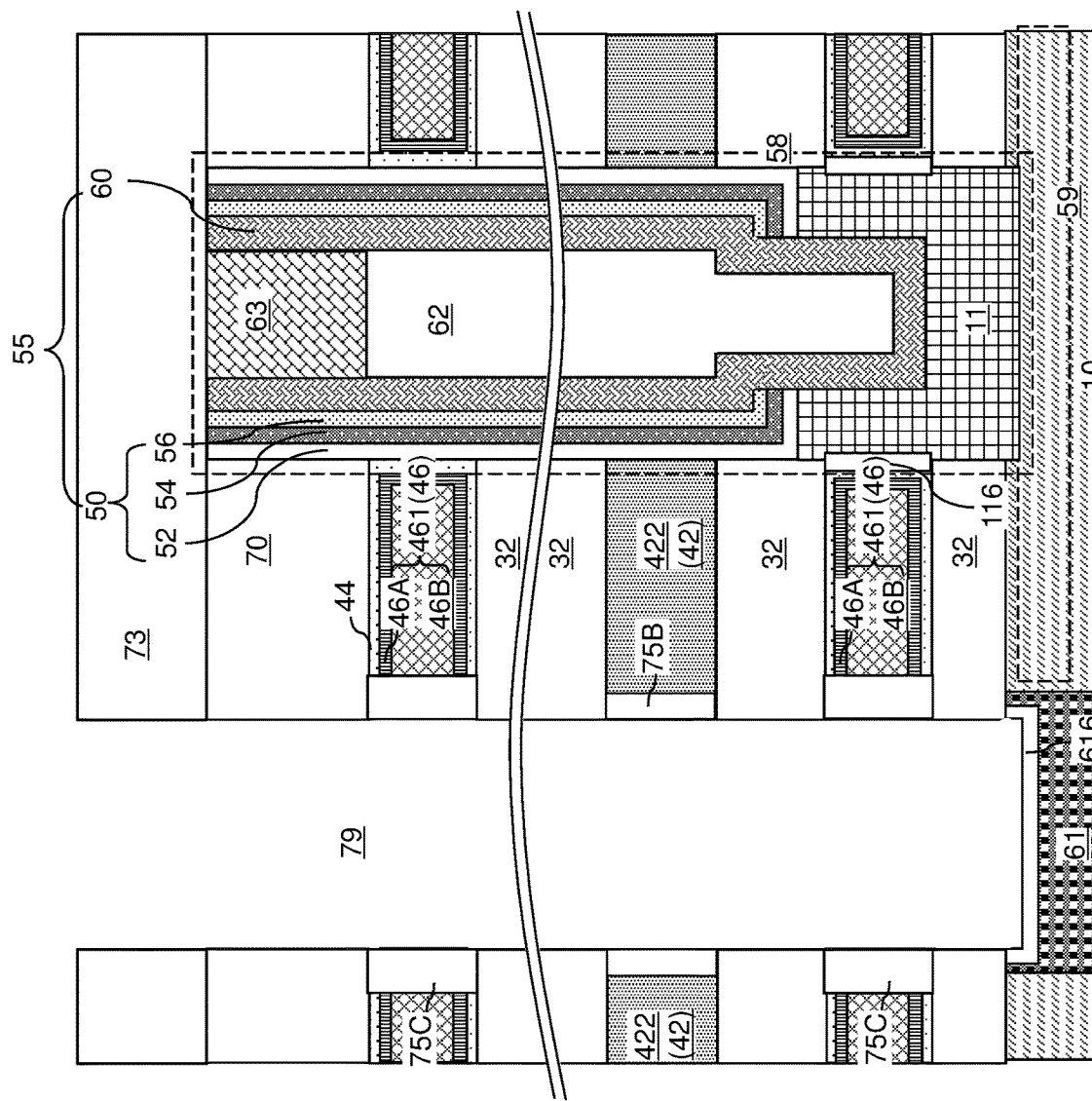

Referring to FIG. 11C, a dielectric spacer material can be deposited in the backside lateral recesses and at peripheral regions of the backside trenches 79 by a conformal deposition process. The dielectric spacer material includes a dielectric material that is different from the material of the second sacrificial material layers 422. In one embodiment, the dielectric spacer material may include a silicon oxide material (such as undoped silicate glass material or a doped silicate glass material), or a dielectric metal oxide material such as aluminum oxide, hafnium oxide, lanthanum oxide, titanium oxide, etc.

An anisotropic etch process can be performed to remove horizontal portions of the dielectric spacer material. Portions of the dielectric spacer material located outside the volumes of the backside lateral recesses by the anisotropic etch process. Remaining portions of the dielectric spacer material that fill the backside lateral recesses constitute dielectric spacer plates 75C. The dielectric spacer plates 75C may have a greater lateral thickness than the second silicon oxide plates 75B. The dielectric spacer plates 75C may include the same material as, or may include a different material from, the material of the second silicon oxide plates 75B. In one embodiment, each of the dielectric spacer plates 75C may laterally extend straight along the first horizontal direction hd1 with a respective uniform lateral thickness.

Figure 11D:
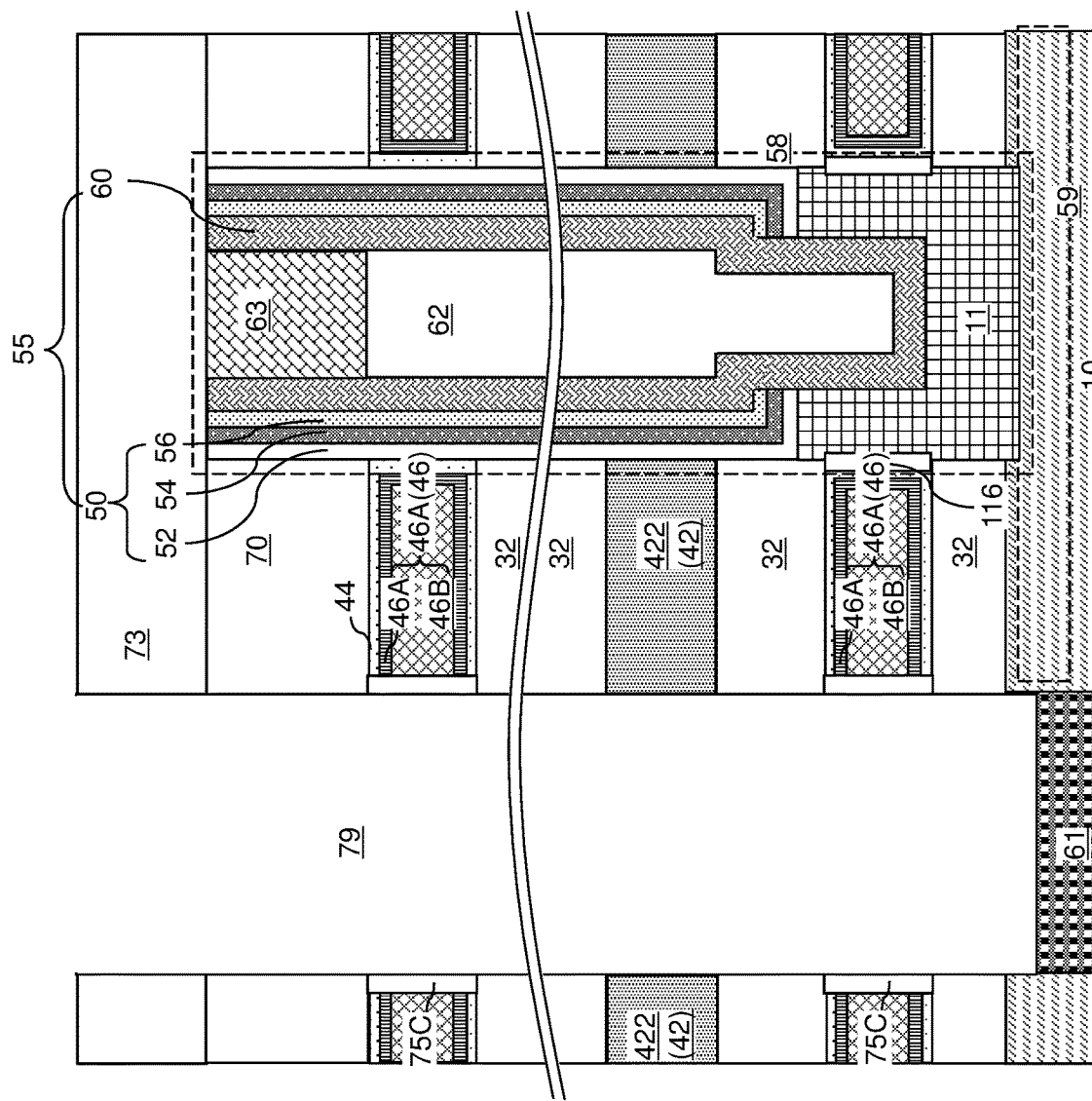

Referring to FIG. 11D, a second silicon oxide recess etch process can be performed to remove the second silicon oxide plates 75B. The second silicon oxide recess etch process may be isotropic or anisotropic. The dielectric spacer plates 75C and the insulating layers 32 may be collaterally partially etched by the second silicon oxide isotropic recess etch process. For example, the second silicon oxide recess etch process may comprise a second wet etch process employing dilute hydrofluoric acid. The dilution of the etchant and the duration of the second silicon oxide recess etch process may be selected such that the entirety of the second silicon oxide plates 75B is removed while at least a portion of the dielectric spacer plates 75C remains at each level of the first electrically conductive layers 461. Thus, sidewalls of the second sacrificial material layers 422 can be physically exposed to the backside trench 79, while each of the first electrically conductive layers 461 is covered with a respective dielectric spacer plate 75C. The planar dielectric portions 616 may be collaterally removed during the second silicon oxide isotropic recess etch process.

Figure 11E:
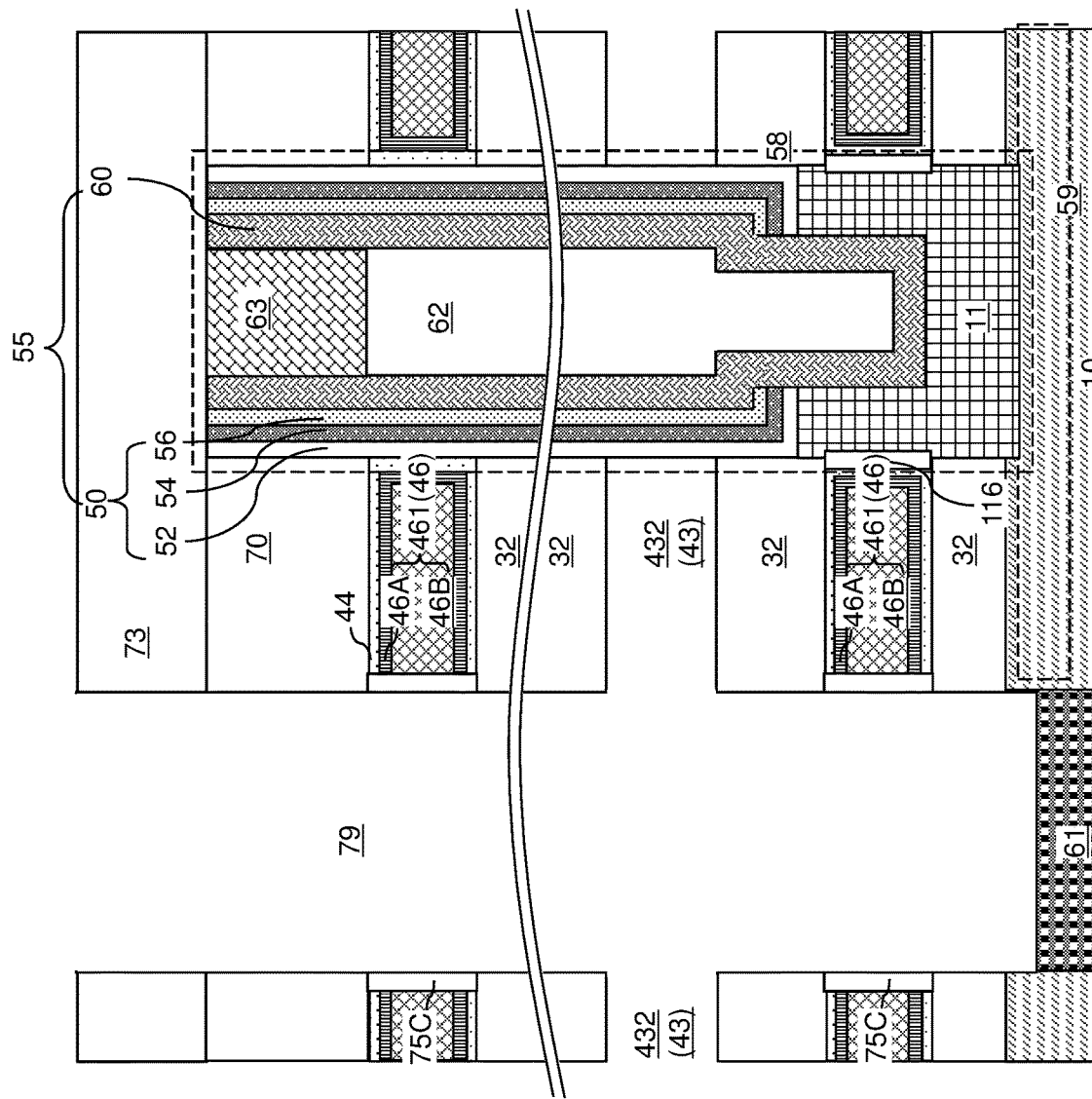

Referring to FIG. 11E, a second isotropic etch process can be performed, in which an etchant that selectively etches the material of the second sacrificial material layers 422 with respect to the materials of the insulating layers 32 and the dielectric spacer plates 75C is introduced into the backside cavities 79'. Second backside recesses 432 (which is a subset of backside recesses 43 that are formed during the manufacturing sequence of the present disclosure) are formed in volumes from which the second sacrificial material layers 422 are removed. The removal of the second sacrificial material of the second sacrificial material layers 422 can be selective to the material of the insulating layers 32, the material of the dielectric spacer plates 75C, the material of the retro-stepped dielectric material portion 65, the material of the source regions 61, and the material of the outermost layer of the memory films 50 (such as the blocking dielectric layer 52).

The second isotropic etch process can be a wet etch process employing a wet etch solution, or can be a gas phase (dry) etch process in which the etchant is introduced in a vapor phase into the backside trenches 79. For example, if the second sacrificial material layers 422 include silicon nitride, the etch process can be a wet etch process in which the exemplary structure is immersed within a wet etch tank including phosphoric acid, which etches silicon nitride selective to silicon oxide, silicon, and various other materials employed in the art. If the second sacrificial material layers 422 include silicon germanium, the etch process can be a wet etch process in which the exemplary structure is immersed within a wet etch tank including a mixture of dilute hydrofluoric acid and hydrogen peroxide, which etches silicon germanium selective to silicon oxide, silicon, and various other materials employed in the art. If the second sacrificial material layers 422 include silicon (e.g., amorphous silicon or polysilicon), then hot trimethyl-2 hydroxyethyl ammonium hydroxide ("hot TMY") or tetramethyl ammonium hydroxide (TMAH) etch may be used.

The support pillar structure 20, the retro-stepped dielectric material portion 65, and the memory stack structures 55 provide structural support while the second backside recesses 432 are present within volumes previously occupied by the second sacrificial material layers 422. Since the first electrically conductive layers 461 are protected by the plates 75C, the layers 461 are not etched and remain in the alternating stack. Therefore, they provide additional support to the alternating stack, and prevent or reduce insulating layer 32 buckling and pattern collapse into the second backside recesses 432.

Each second backside recess 432 can be a laterally extending cavity having a lateral dimension that is greater than the vertical extent of the cavity. In other words, the lateral dimension of each second backside recess 432 can be greater than the height of the backside recess 43. A plurality of second backside recesses 432 can be formed in the volumes from which the second sacrificial material of the second sacrificial material layers 422 is removed. The memory openings in which the memory stack structures 55 are formed are herein referred to as front side openings or front side cavities in contrast with the second backside recesses 432. In one embodiment, the memory array region 100 comprises an array of three-dimensional NAND strings having a plurality of device levels disposed above the substrate (9, 10). In this case, each second backside recess 432 can define a space for receiving a respective word line of the array of three-dimensional NAND strings.

Each of the plurality of second backside recesses 432 can extend substantially parallel to the top surface of the substrate (9, 10). A second backside recess 432 can be vertically bounded by a top surface of an underlying insulating layer 32 and a bottom surface of an overlying insulating layer 32. In one embodiment, each second backside recess 432 can have a uniform height throughout.

Figure 12A:
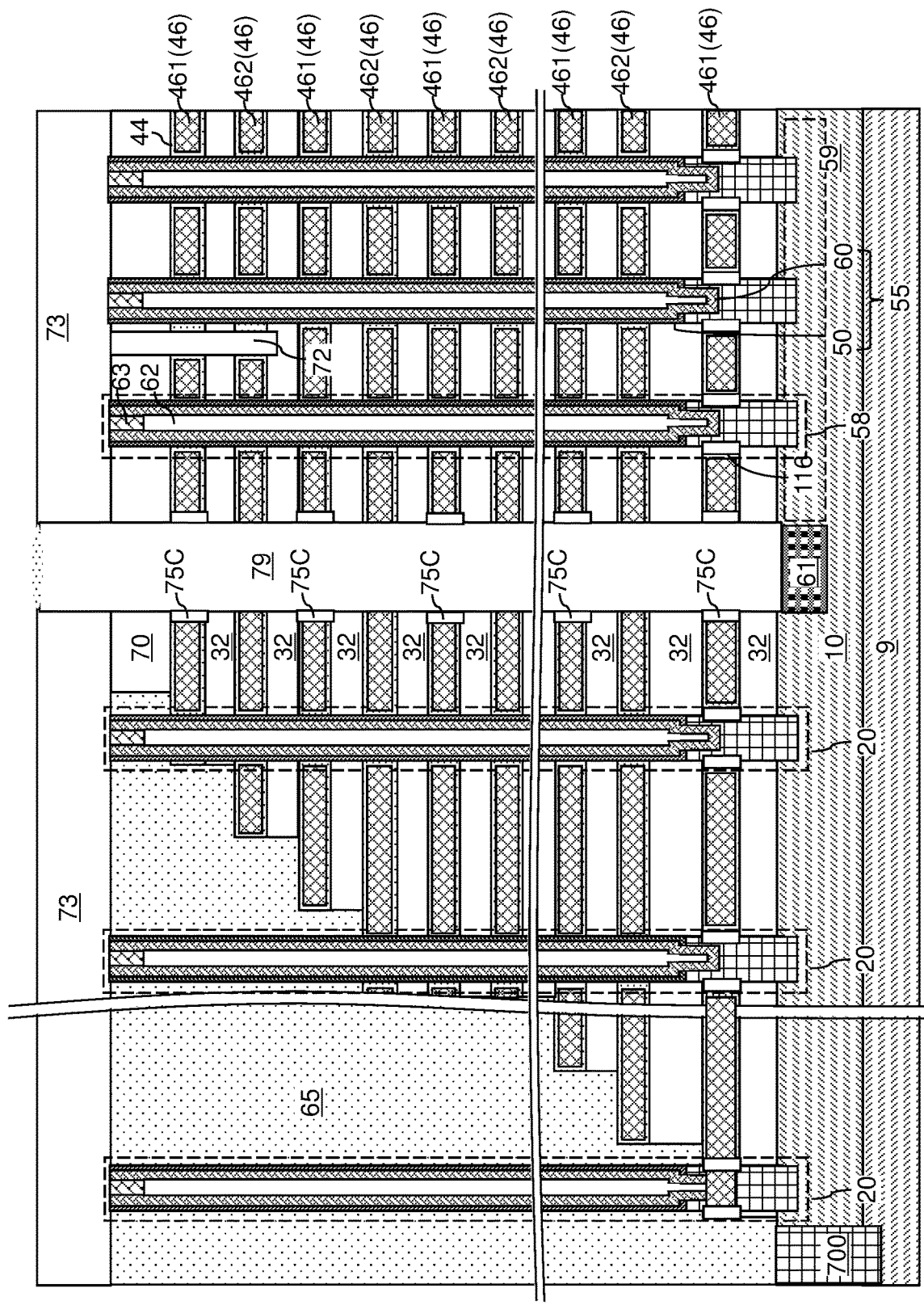
FIG. 12A is a schematic vertical cross-sectional view of the exemplary structure after formation of second electrically conductive layers according to an embodiment of the present disclosure.
Figure 12B:
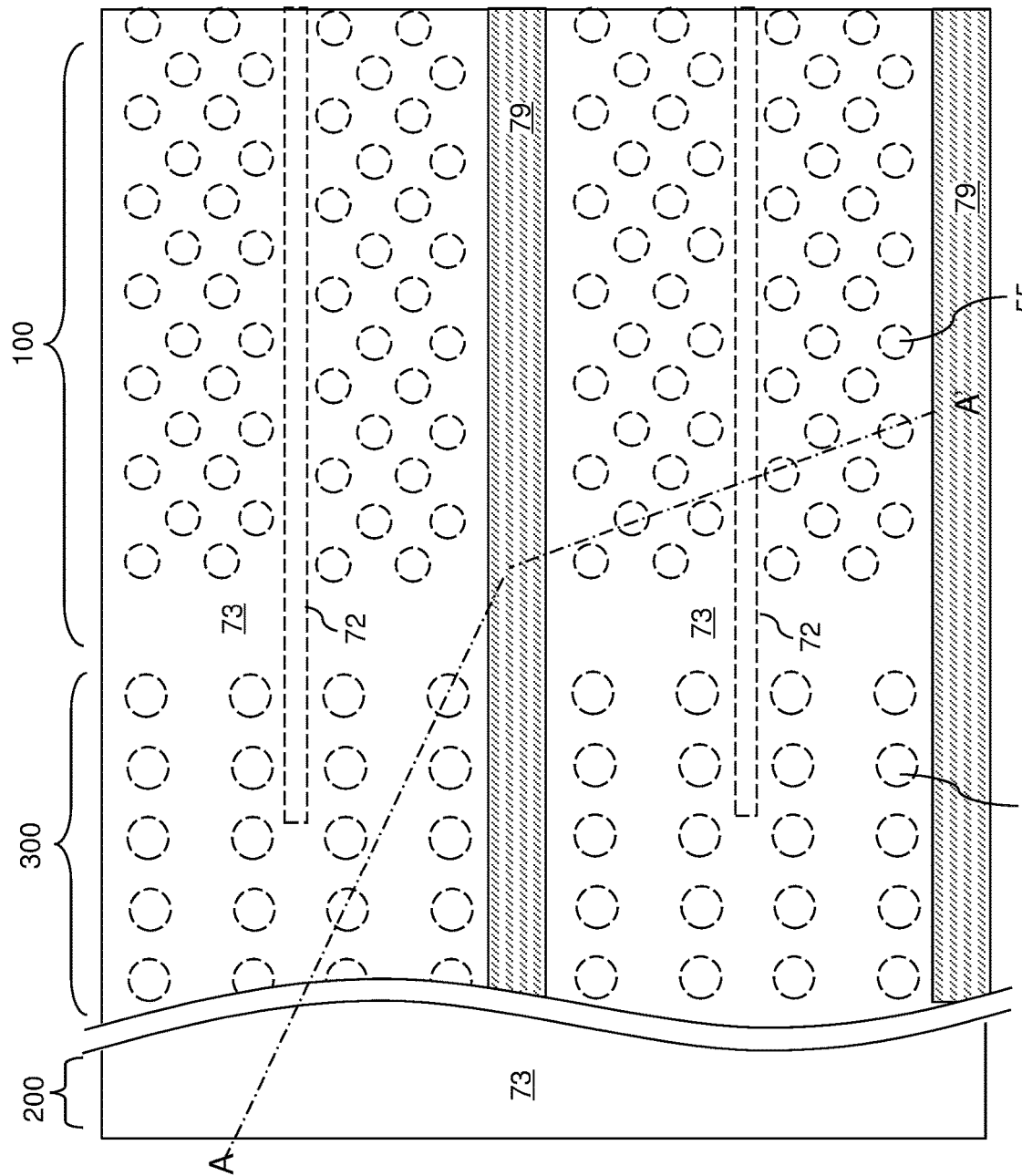
FIG. 12B is a partial see-through top-down view of the exemplary structure of FIG. 12A. The vertical plane A-A' is the plane of the schematic vertical cross-sectional view of FIG. 12A.
Figure 12C:
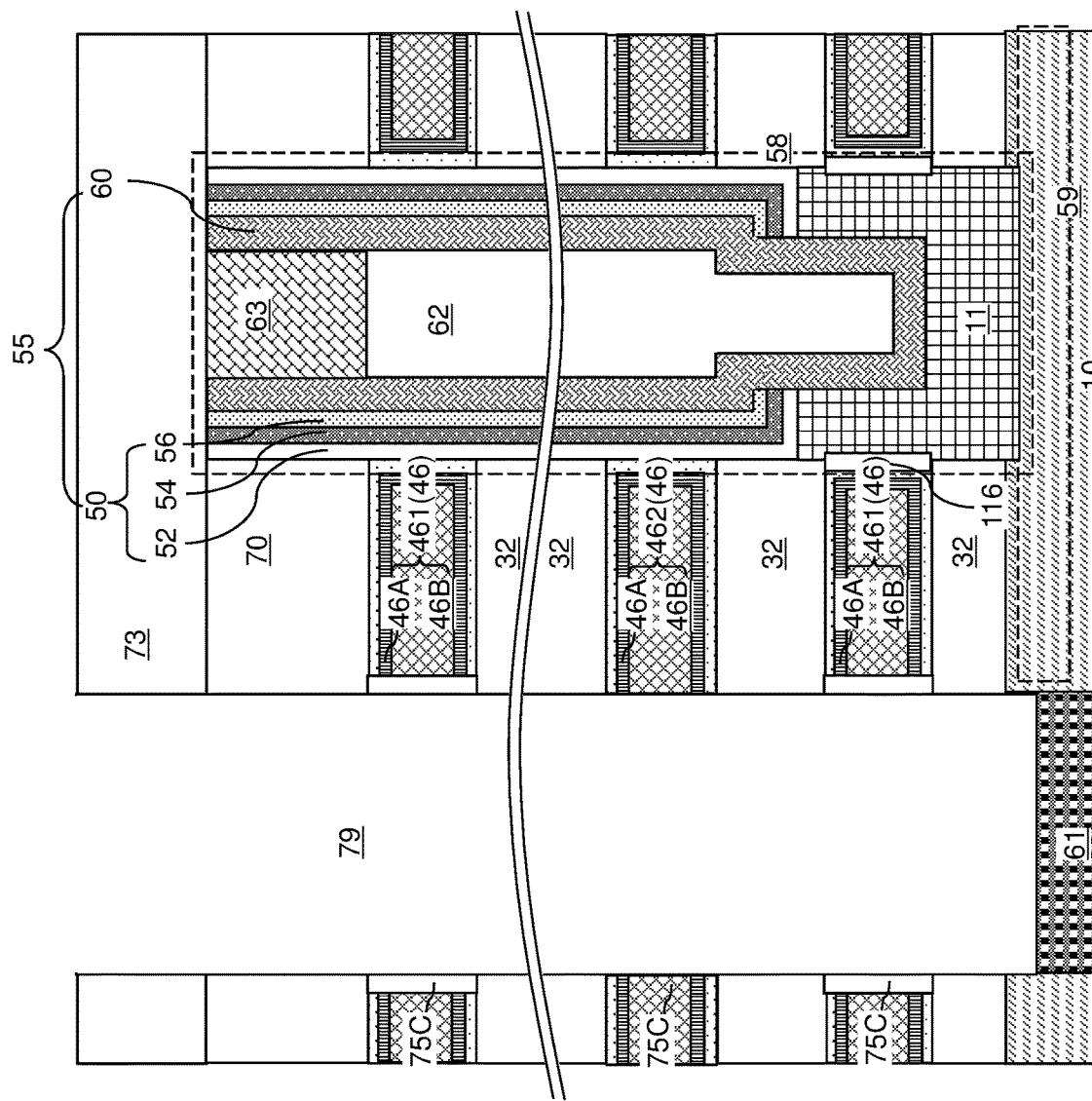
FIG. 12C is a magnified view of a region of the exemplary structure of FIG. 12A.

Referring to FIG. 12A-12C, a second backside blocking dielectric layer 44 can be optionally formed by a conformal deposition process. The second backside blocking dielectric layer 44 may comprise the same material as, and may have the same thickness as, the first backside blocking dielectric layers 44, and may be formed by a same deposition process.

At least one second electrically conductive material can be deposited in the remaining volumes of the second backside recesses 432. For example, a metallic barrier layer 46A and a metallic fill material layer 46B can be deposited in the same manner as in the processing steps of FIGS. 11A and 11B.

A continuous second electrically conductive material layer formed in the backside trenches 79 and over the contact-level dielectric layer 73 can be etched back by an isotropic wet etch, an anisotropic dry etch, or a combination thereof. Each remaining portion of the deposited metallic material in the second backside recesses 432 constitutes a second electrically conductive layer 462. Each second electrically conductive layer 462 can be a conductive line structure.

Each second electrically conductive layer 462 can function as a combination of a plurality of control gate electrodes located at a same level and a word line electrically interconnecting, i.e., electrically shorting, the plurality of control gate electrodes located at the same level. The plurality of control gate electrodes within each second electrically conductive layer 462 are the control gate electrodes for the vertical memory devices including the memory stack structures 55. In other words, each second electrically conductive layer 462 can be a word line that functions as a common control gate electrode for the plurality of vertical memory devices. A backside cavity 79' is present within each backside trench 79. Each of the second electrically conductive layers 462 may have sidewalls that are physically exposed to a respective backside trench 79 and are vertically coincident with sidewalls of the insulating layers 32 that are physically exposed to the respective backside trench 79. The electrically conductive layers 46 comprise a vertically alternating sequence of first electrically conductive layers 461 and second electrically conductive layers 462 that are interlaced along a vertical direction.

Figure 13:
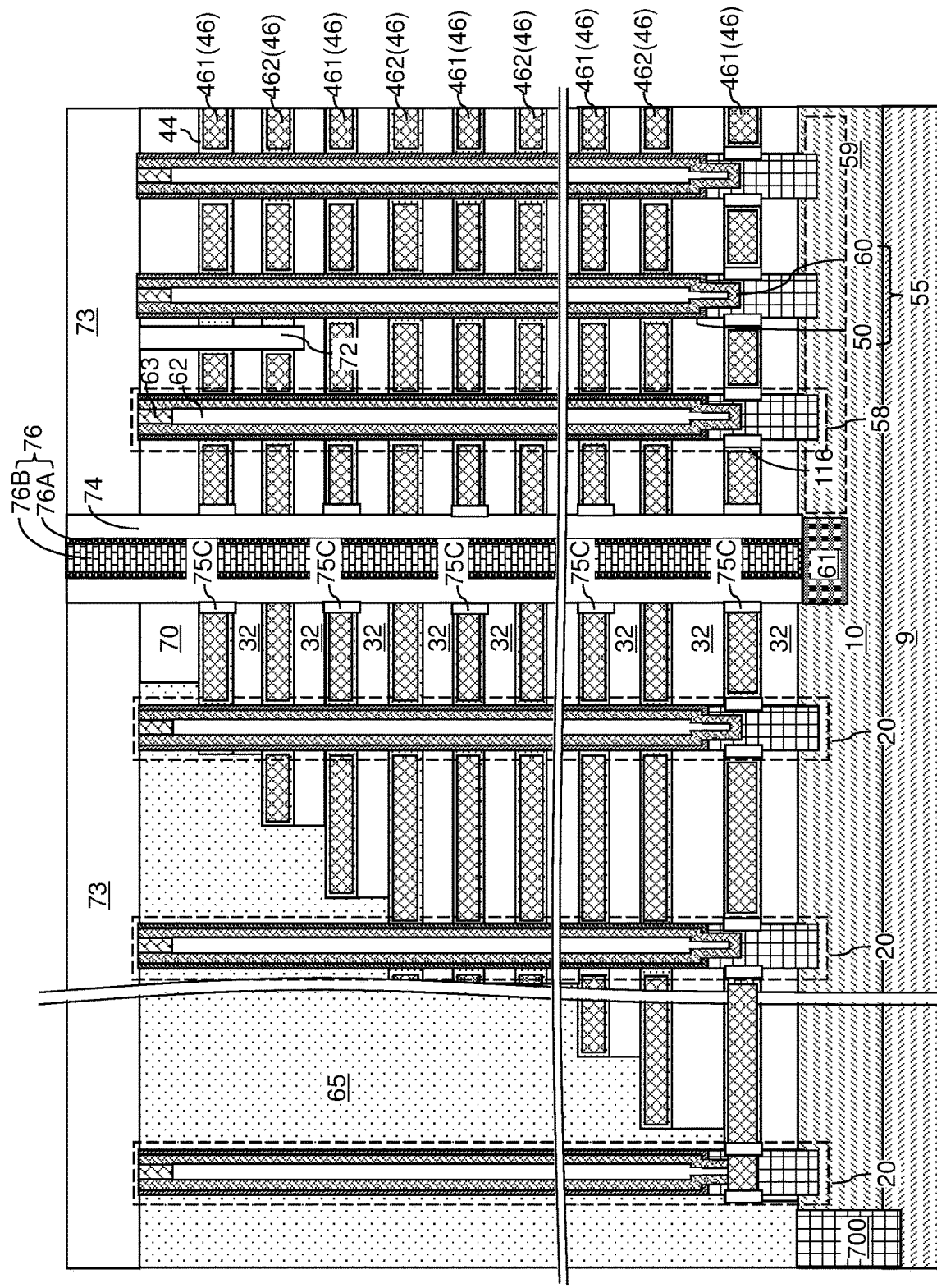
FIG. 13 is a schematic vertical cross-sectional view of the exemplary structure after formation of an insulating spacer and a backside contact structure according to an embodiment of the present disclosure.

Referring to FIG. 13, a backside insulating material portion such as an insulating spacer 74 may be formed in each backside trench 79. For example, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. The set of material portions that fills a backside trench 79 constitutes a backside trench fill structure (74, 76), which includes at least a backside insulating material portion (such as an insulating spacer 74) and optionally includes a backside contact via structure 76.

Generally, each backside insulating material portion (such as an insulating spacer 74) comprises sidewalls that vertically extend at least from a topmost layer in the alternating stack of insulating layers 32 and electrically conductive layers 46 to a top surface of the substrate (9, 10, 61) such as a surface of a source region 61. Each of the second electrically conductive layers 462 can be in direct contact with one of the sidewalls of the backside insulating material portion (such as the insulating spacer 74).

Each sidewall of the backside insulating material portion (such as the insulating spacer 74) may have a straight vertical cross-sectional profile. In this case, the sidewalls of the backside insulating material portion (such as the insulating spacer 74) may be free of any lateral step. In one embodiment, the sidewalls of the backside insulating material portion have a respective straight vertical cross-sectional profile that extends from a topmost surface of the backside insulating material portion to a bottommost surface of the backside insulating material portion. In one embodiment, the sidewalls of the backside insulating material portion comprise a pair of lengthwise sidewalls that laterally extend straight along the first horizontal direction hd1 in a horizontal cross-sectional view.

In one embodiment, the backside trench fill structure (74, 76) comprises a backside contact via structure 76 that is laterally surrounded by the backside insulating material portion (such as an insulating spacer 74), vertically extends through each layer within the alternating stack (32, 46), and contacts a top surface of a portion of the substrate (9, 10, 61) such as a top surface of a source region 61.

In one embodiment, the substrate (9, 10, 61) comprises a semiconductor material layer 10 having a doping of a first conductivity type; and the portion of the substrate (9, 10, 61) in contact with the backside contact via structure 76 comprises a semiconductor material having a doping of a second conductivity type that is an opposite of the first conductivity type, such as a source region 61.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact an side of the lower portion of the semiconductor channel 60.

In one embodiment, the backside blocking dielectric layers 44 can be located between each vertically neighboring pair of an insulating layer 32 among the insulating layers 32 and an electrically conductive layer 46 among the electrically conductive layers 46. A first subset of the backside blocking dielectric layers (i.e., the first backside blocking dielectric layers 44) that is in contact with the first electrically conductive layers 461 can be laterally spaced from the backside insulating material portion (such as an insulating spacer 74), and a second subset of the backside blocking dielectric layers 44 that is in contact with the second electrically conductive layers 462 can be in contact with the backside insulating material portion. In one embodiment, each of the first electrically conductive layers 461 can be laterally spaced from the backside insulating material portion by a respective dielectric spacer plate 75C; and each of the second electrically conductive layers 462 can be in direct contact with the backside insulating material portion.

Figure 14A:
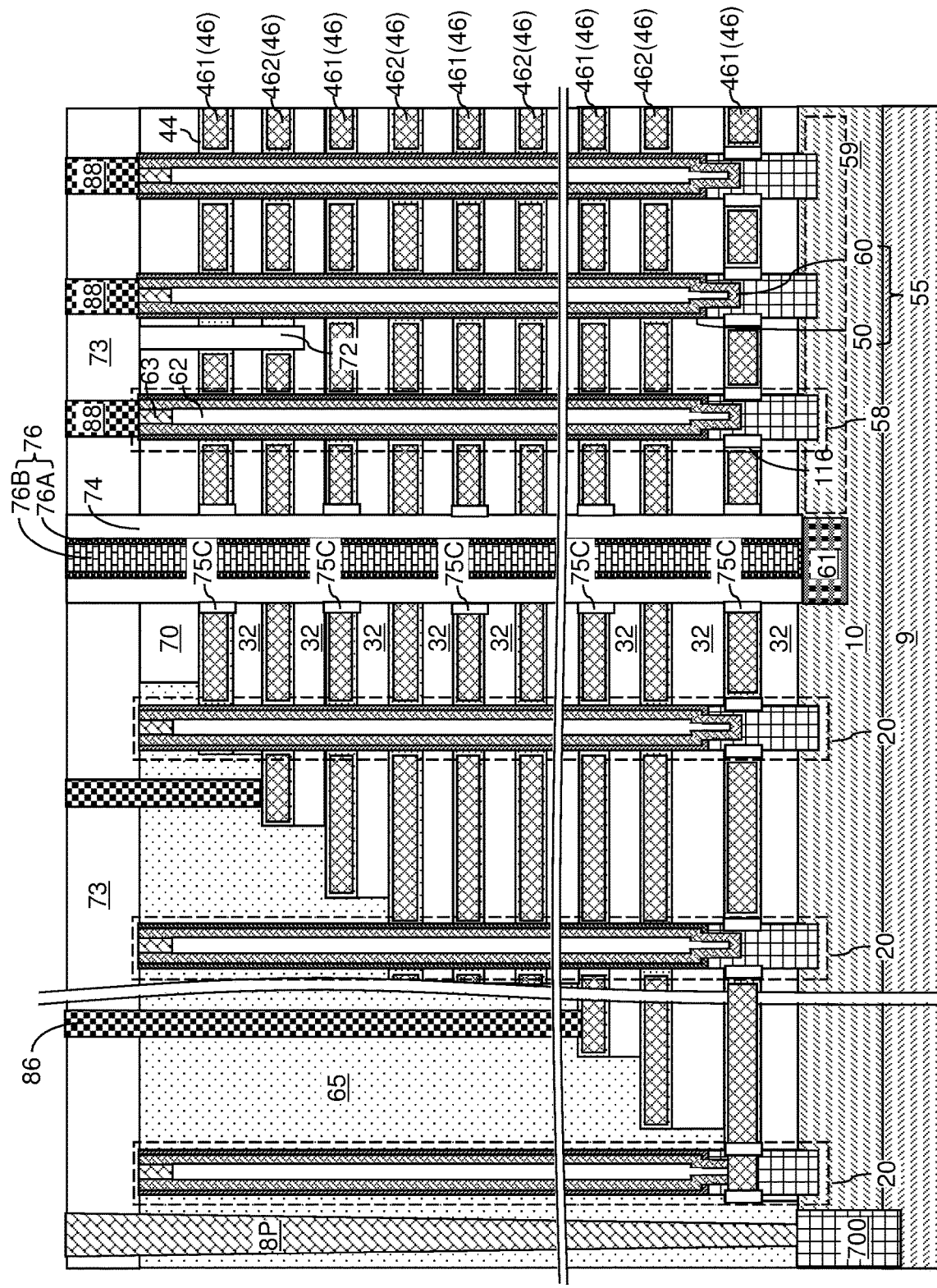
FIG. 14A is a schematic vertical cross-sectional view of the exemplary structure after formation of additional contact via structures according to an embodiment of the present disclosure.
Figure 14B:
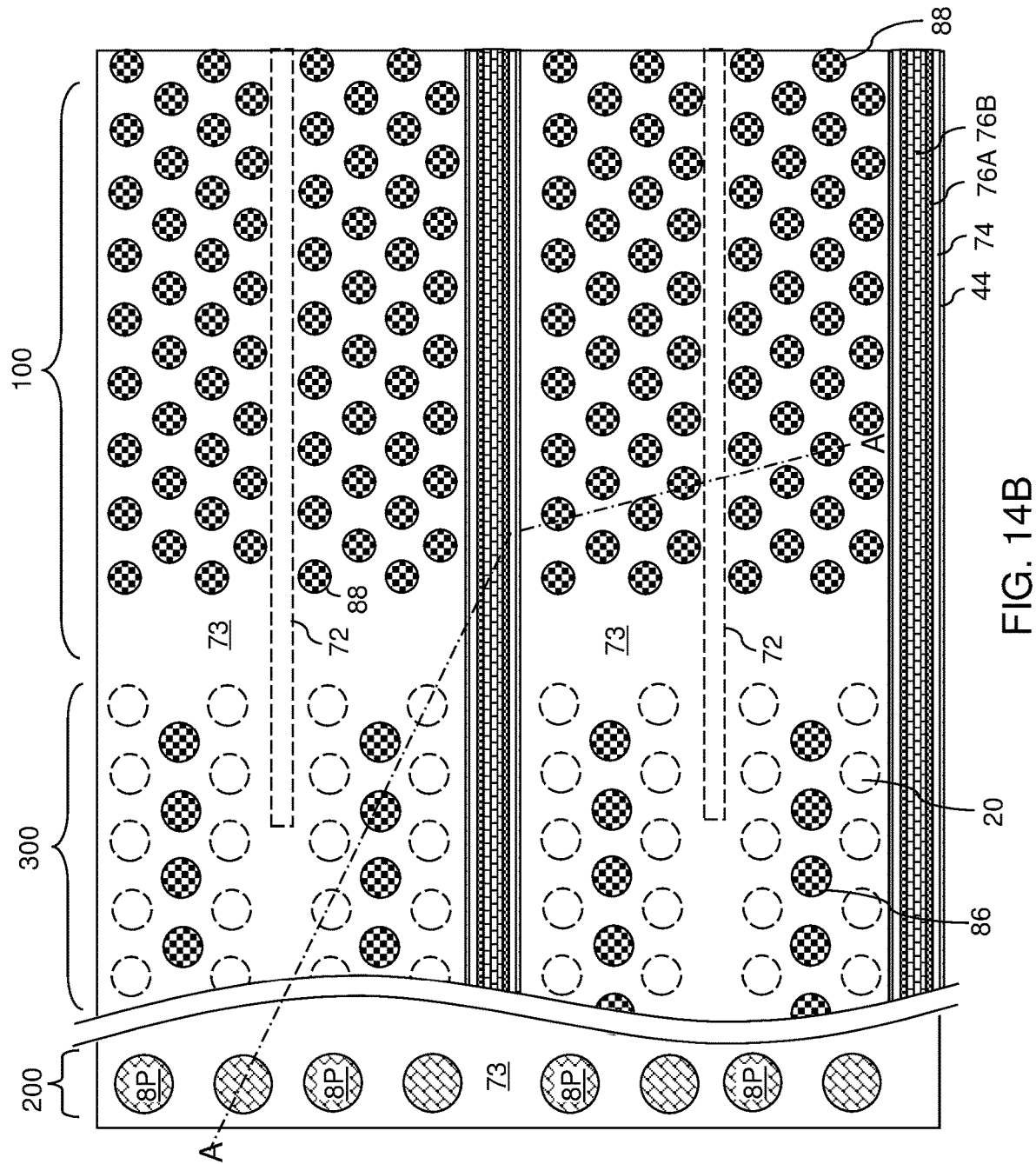
FIG. 14B is a top-down view of the exemplary structure of FIG. 14A. The vertical plane A-A' is the plane of the schematic vertical cross-sectional view of FIG. 14A.
Figure 14C:
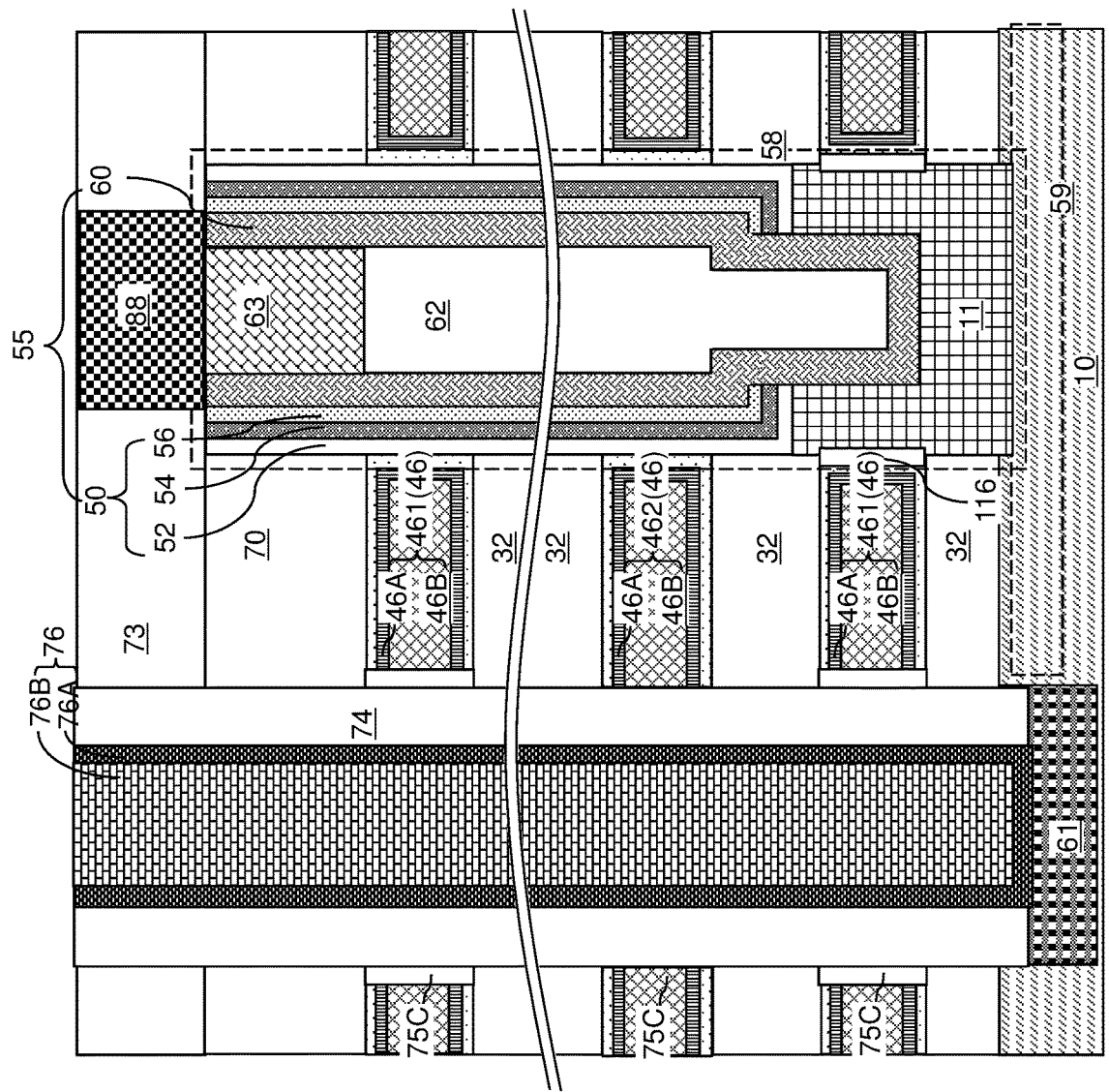
FIG. 14C is a magnified view of a region of the exemplary structure of FIG. 12A.

Referring to FIGS. 14A-14C, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

In one embodiment, upon sequentially numbering the electrically conductive layers 46 from bottom to top with positive integers beginning with 1, each odd-numbered electrically conductive layer can be one of the first electrically conductive layers 461 and each even-numbered electrically conductive layer can be one of the second electrically conductive layers 462.

Figure 15:
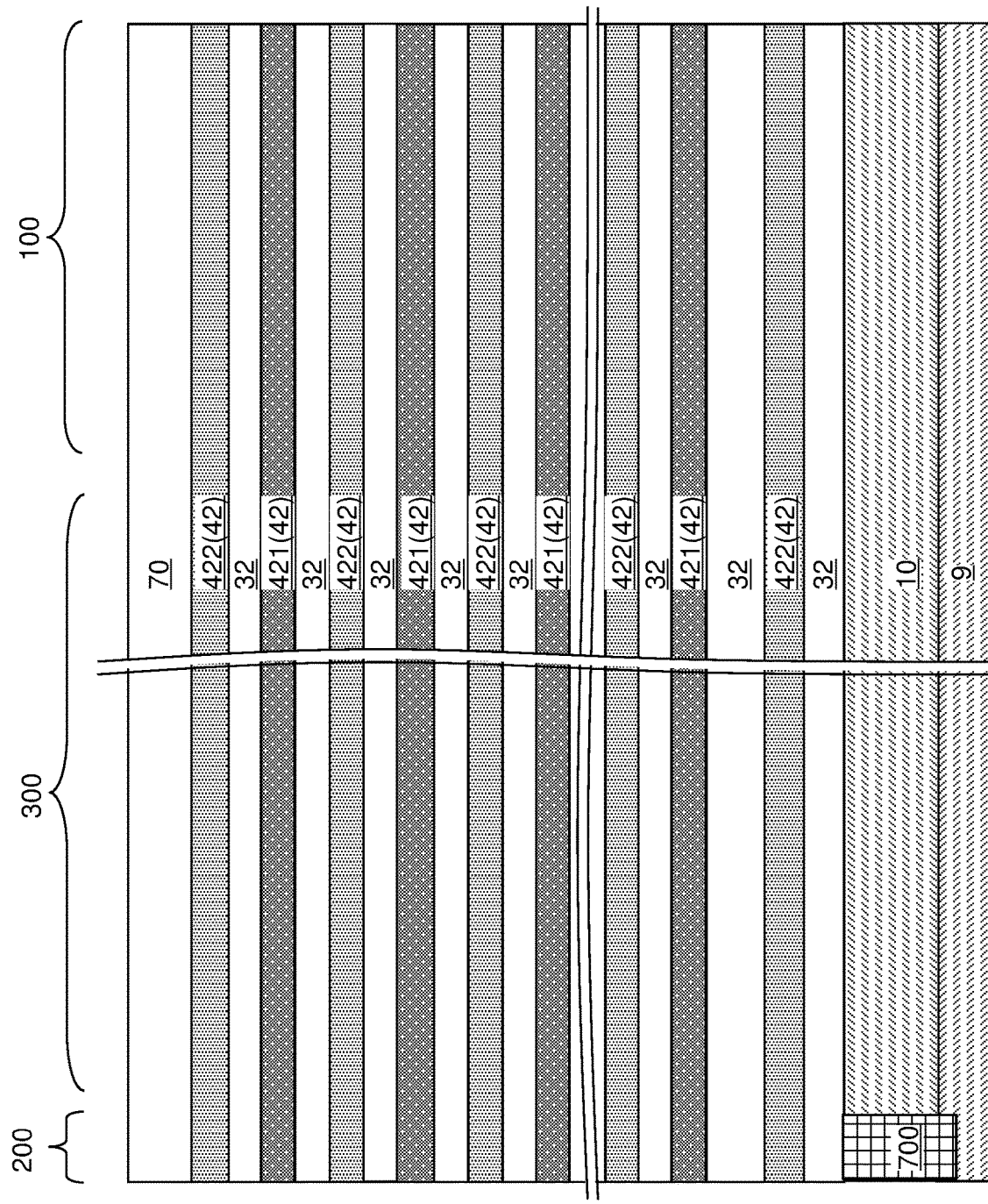
FIG. 15 is a vertical cross-sectional view of an alternative configuration of the exemplary structure at the processing steps of FIG. 2.

Referring to FIG. 15, an alternative configuration of the exemplary structure is illustrated at the processing steps of FIG. 2. The alternative configuration of the exemplary structure can be derived from the exemplary structure of FIG. 2 by exchanging the positions of the first sacrificial material layers 421 and the second sacrificial material layers 422. Thus, upon sequentially numbering the sacrificial material layers 42 from bottom to top with positive integers beginning with 1, each odd-numbered electrically conductive layer can be one of the second sacrificial material layers 422 and each even-numbered electrically conductive layer can be one of the first sacrificial material layers 421. Subsequently, the processing steps of FIGS. 3-14C can be performed.

Figure 16:
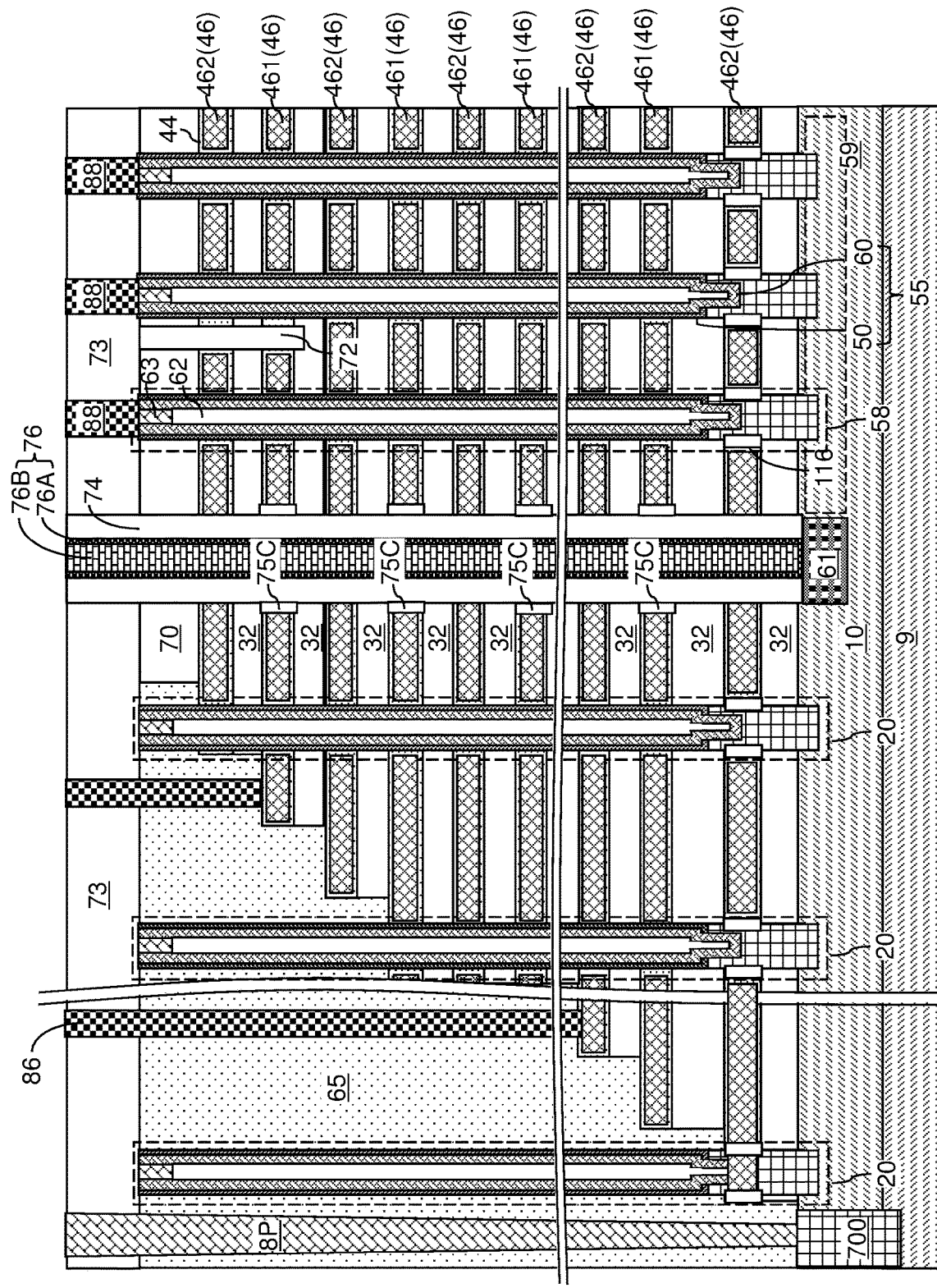
FIG. 16 is a vertical cross-sectional view of the alternative configuration of the exemplary structure at the processing steps of FIGS. 14A-14C.

Referring to FIG. 16, the alternative configuration of the exemplary structure is illustrated at the processing steps of FIGS. 14A-14C. In the alternative configuration of the exemplary structure, upon sequentially numbering the electrically conductive layers 46 from bottom to top with positive integers beginning with 1, each odd-numbered electrically conductive layer can be one of the second electrically conductive layers 462 and each even-numbered electrically conductive layer can be one of the first electrically conductive layers 461.

Figure 17A:
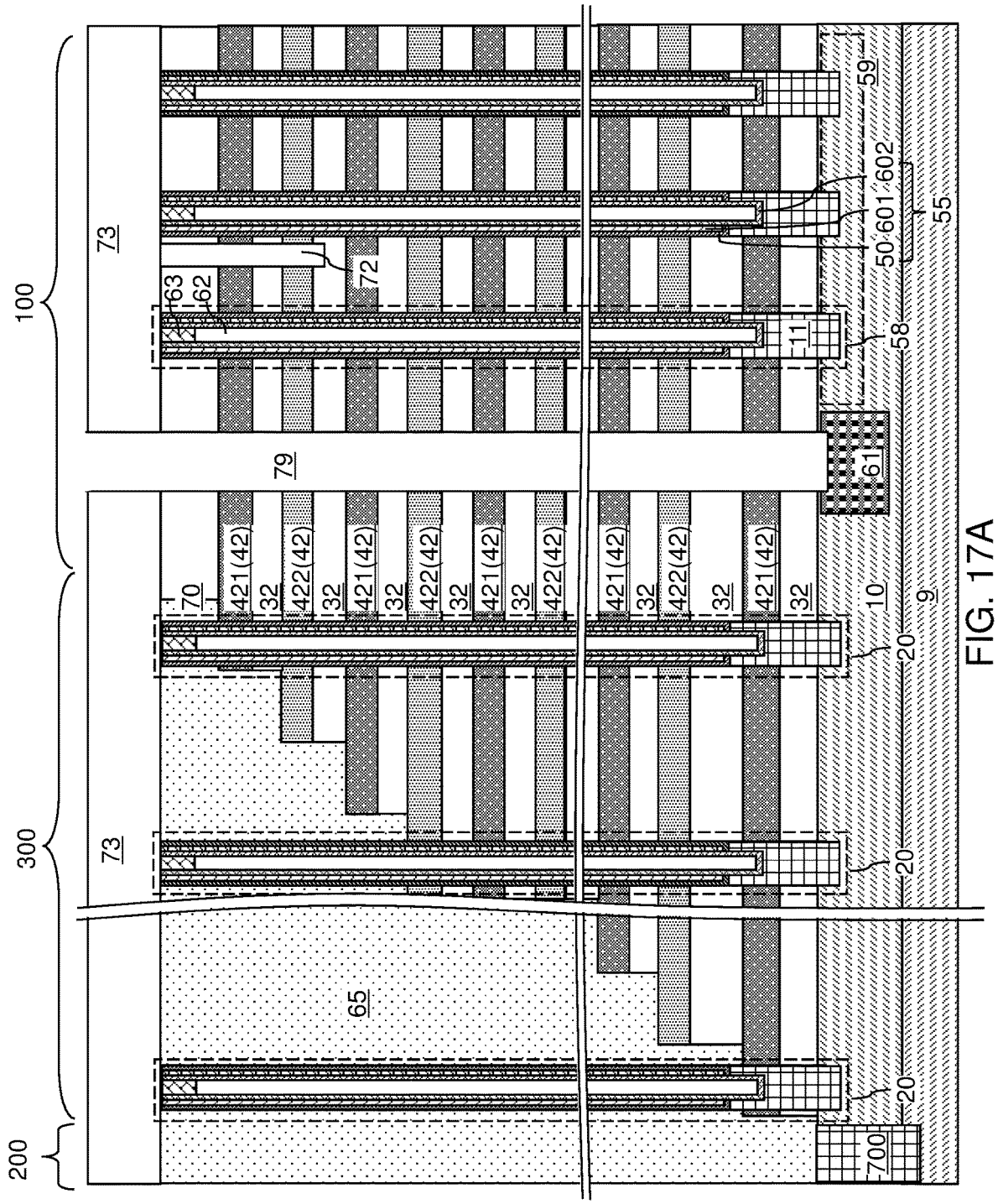
FIGS. 17A-17E are sequential vertical cross-sectional views of a region of another alternative configuration of the exemplary structure during formation of first and second electrically conductive layers according to an alternative embodiment of the present disclosure.

Referring to FIG. 17A, another alternative configuration of the exemplary structure is illustrated at the processing steps of FIG. 7A according to an alternative embodiment of the present disclosure. In the alternative embodiment of FIG. 17A, the first sacrificial material layer 421 comprises a different type of material from the second sacrificial material layer 422. For example, one of the first or second sacrificial material layers comprises silicon nitride, while the other one of the first or second sacrificial material layers comprises a semiconductor material, such as amorphous silicon, polysilicon or silicon germanium. In this alternative embodiment, the silicon oxide plates (75A, 75B, 75C) are omitted.

Figure 17B:
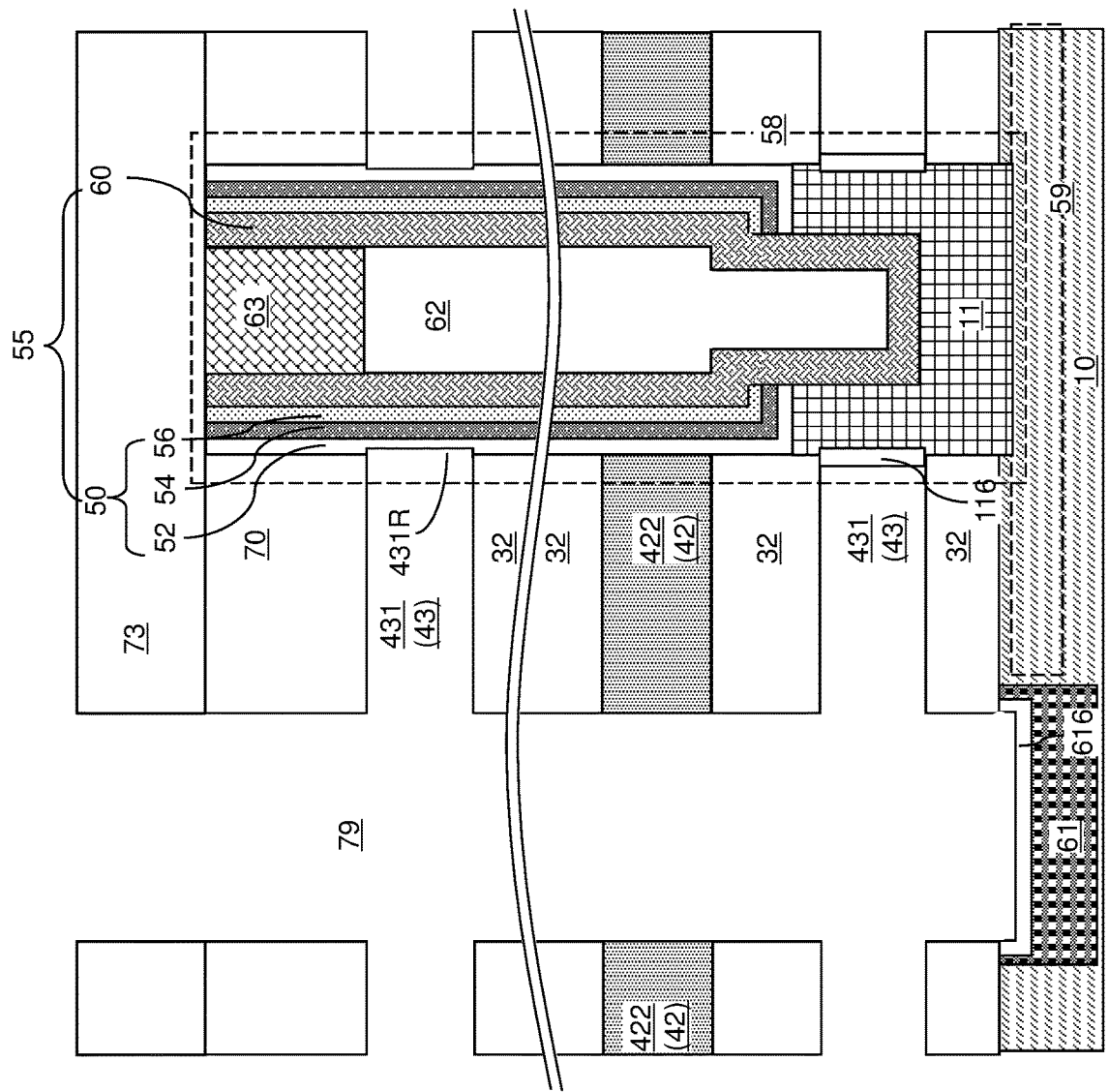

Referring to FIG. 17B, the step of FIGS. 10A and 10B is performed to selectively remove first sacrificial material layers 421 by selective isotropic etching without removing the second sacrificial material layers 422. For example, if the first sacrificial material layers 421 comprise silicon nitride and the second sacrificial material layers 422 comprise amorphous silicon, then a hot phosphoric acid etch may be used to selectively remove the first sacrificial material layers 421. The hot phosphoric acid etch may cut into the memory film 50, such as into the blocking dielectric layer 52, such that a respective recess 431R is formed in the blocking dielectric layer 52 at the level of the first backside recesses 431.

Figure 17C:
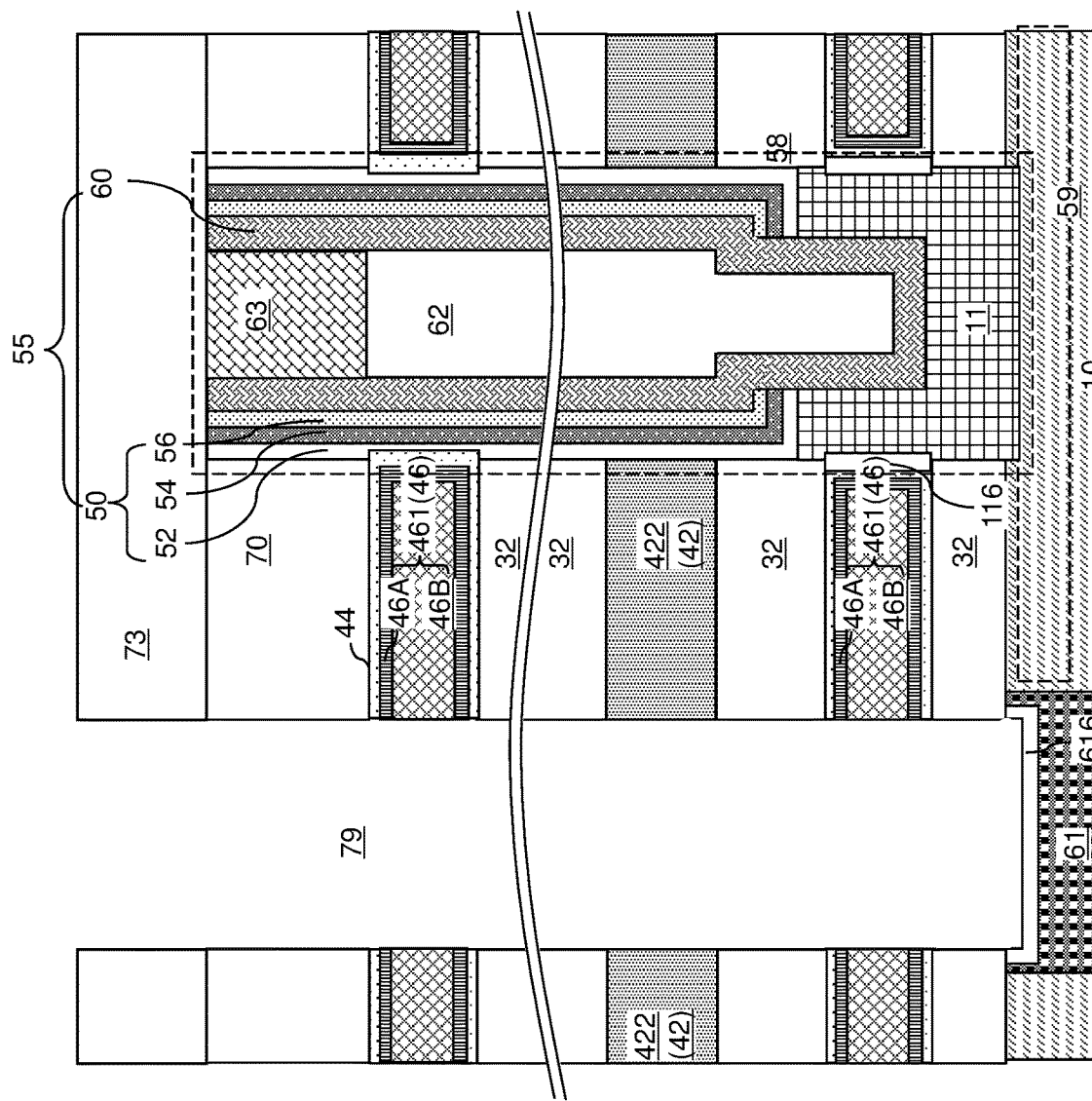

Referring to FIG. 17C, the process of FIG. 11A is performed to form the plurality of first electrically conductive layers 461 in the plurality of respective first backside recesses 431. The first electrically conductive layers 461 and/or the backside blocking dielectric layer 44 (if present) extend into the respective recesses 431R in the memory film 50 (e.g., in the blocking dielectric layer 52).

Figure 17D:
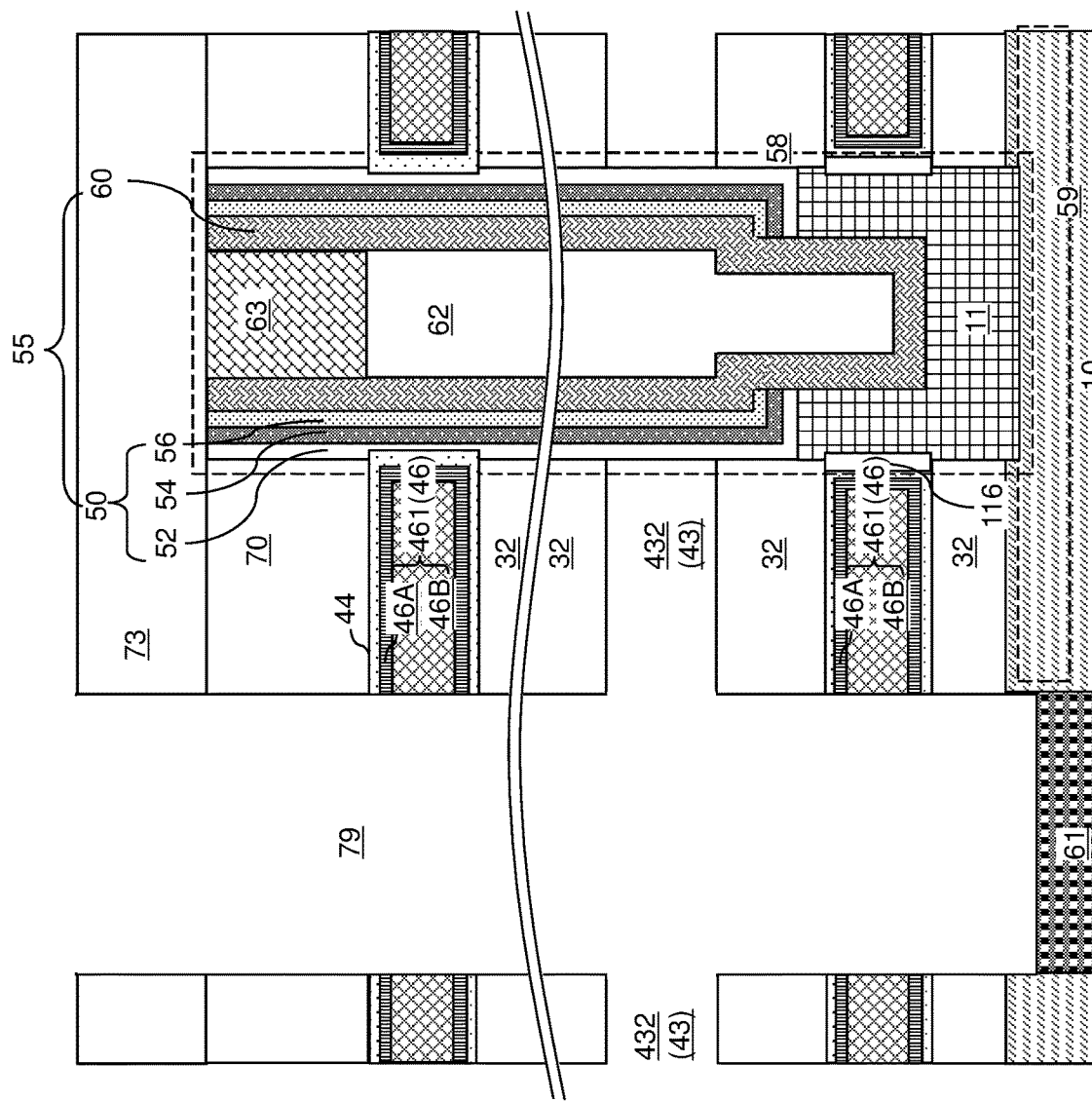

Referring to FIG. 17D, the process of FIG. 11D is performed to selectively remove the second sacrificial material layers 422 relative to the first electrically conductive layers 461 and the insulating layers 32. For example, if the second sacrificial material layers 422 comprise amorphous silicon, then a wet etch using TMAH or TMY may be used to form the plurality of second backside recesses 432. The etch may not form a recess in the memory film 50, such as in the blocking dielectric layer 52, or may form a recess having a smaller lateral width than the recess 431R.

Figure 17E:
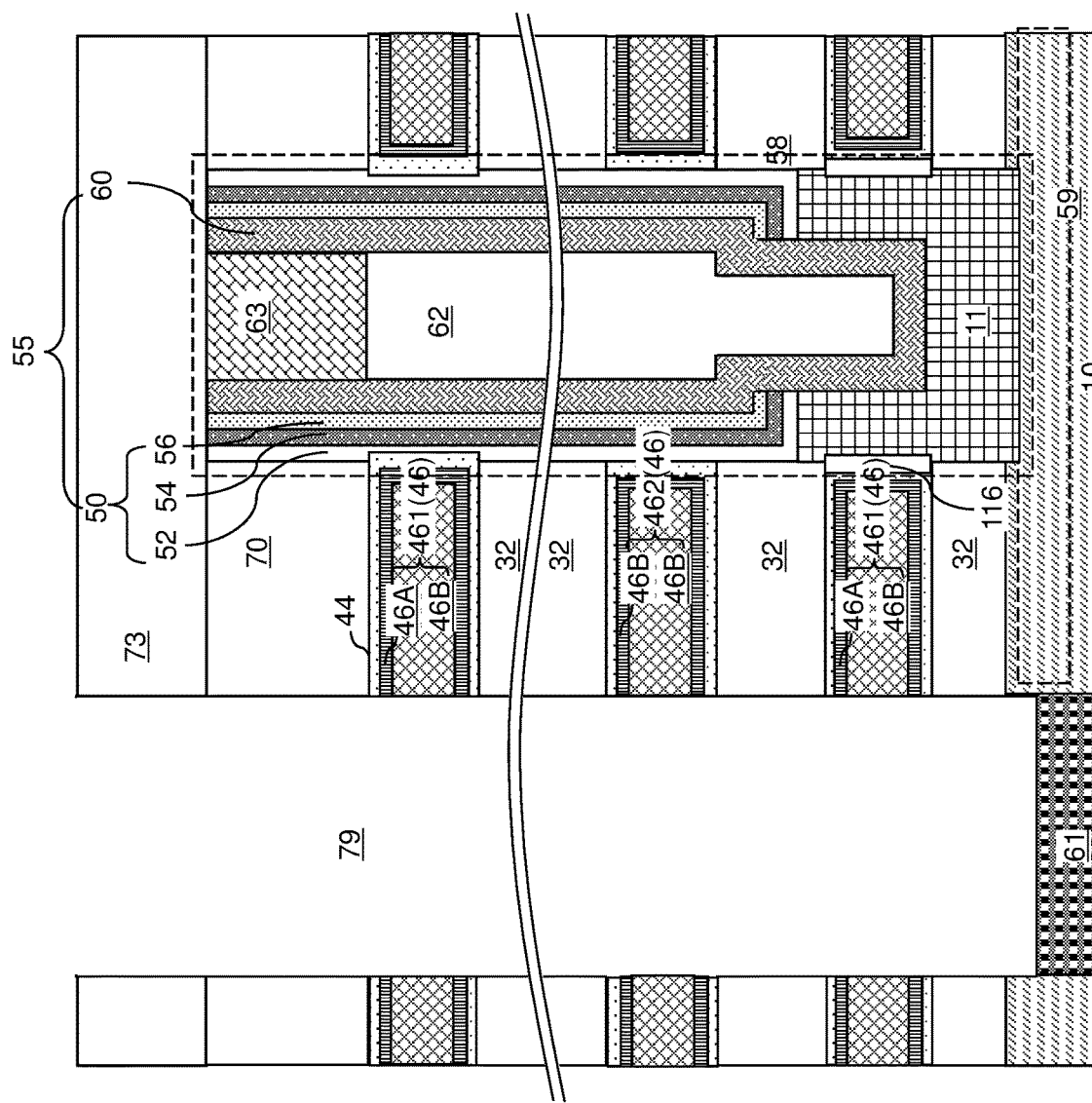

Referring to FIG. 17E the process of FIGS. 12A-12C is performed to form the second electrically conductive layers 462 in the plurality of respective second backside recesses 432. In this alternative embodiment, the first electrically conductive layers 461 and/or the backside blocking dielectric layer 44 (if present) extend into a respective recess 431R in the memory film 50, such as in the blocking dielectric layer 52, while the second electrically conductive layers 462 and/or the backside blocking dielectric layer 44 (if present) do not extend into a recess in the memory film, or extend into a recess in the memory film which has a smaller lateral width than the recess 431R at the levels of the second electrically conductive layers 462.

Figure 18:
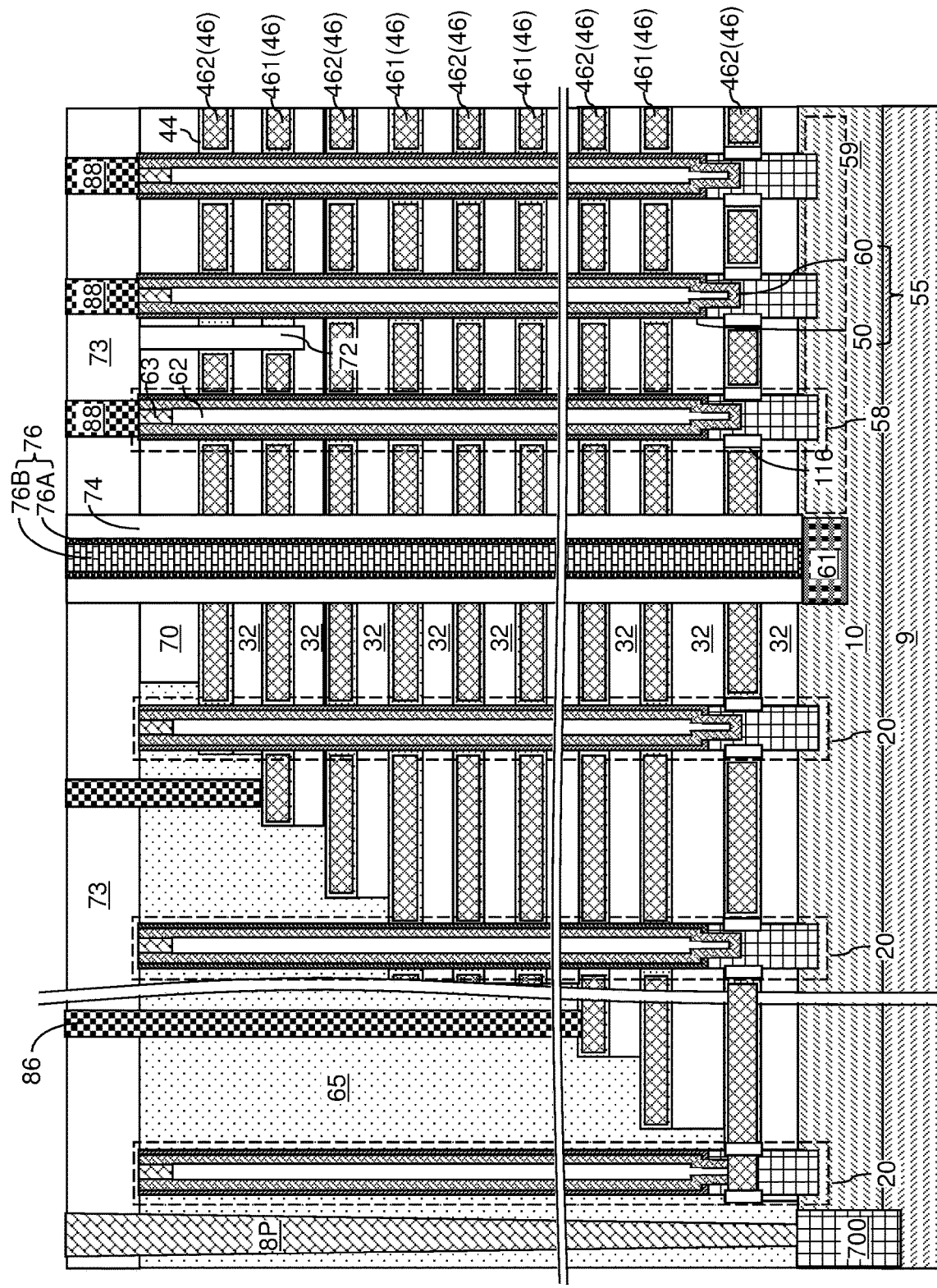
FIG. 18 is a vertical cross-sectional view of another alternative configuration of the exemplary structure at the processing steps of FIGS. 14A-14C.

The process steps of FIGS. 13 and 14A-14B are performed to form the alternative embodiment structure shown in FIG. 18. While the silicon nitride sacrificial material layers are removed prior to removing the semiconductor sacrificial material layers in the above described process, it should be noted that alternatively, the semiconductor sacrificial material layers may be removed prior to removing the silicon nitride sacrificial material layers.

In this alternative embodiment, the silicon oxide plates are not required because the first and second sacrificial material layers (421, 422) comprise different type of materials. The second sacrificial material layers 422 and the insulating layers 32 are not significantly etched by the isotropic etchant used to etch the first sacrificial material layers 421. Likewise, the insulating layers 32 and the first electrically conductive layers 461 are not significantly etched by the isotropic etchant used to etch the second sacrificial material layers 422. The memory film 50 (e.g., the blocking dielectric layer 52) includes a lateral recess 431R at the levels of the first electrically conductive layers 461, and includes no lateral recess or a smaller lateral recess at the levels of the second electrically conductive layers 462.

Referring FIGS. 1 to 16, and according to various embodiments of the present disclosure, a memory device is provided, which comprises: an alternating stack of insulating layers 32 and electrically conductive layers 46; a memory opening 49 vertically extending through the alternating stack (32, 46); a memory opening fill structure 58 located in the memory opening 49 and comprising a vertical semiconductor channel 60 and a vertical stack of memory elements (comprising portions of a memory material layer 54) located at levels of the electrically conductive layers 46; a backside trench 79 vertically extending through the alternating stack (32, 46); and a backside trench fill structure (74, 76) comprising a backside insulating material portion (such as an insulating spacer 74), wherein: the electrically conductive layers 46 comprise a vertically alternating sequence of first electrically conductive layers 461 and second electrically conductive layers 462 that are interlaced along a vertical direction; each of the first electrically conductive layers 461 is laterally spaced from the backside insulating material portion (such as the insulating spacer 74) by a respective dielectric spacer plate 75C; and each of the second electrically conductive layers 462 is in direct contact with the backside insulating material portion (such as the insulating spacer 74).

In one embodiment, the backside insulating material portion (such as the insulating spacer 74) comprises sidewalls that vertically extend at least from a topmost layer in the alternating stack (32, 46) to a top surface of the substrate (9, 10) underlying the alternating stack; and each of the second electrically conductive layers 462 is in direct contact with one of the sidewalls of the backside insulating material portion. In one embodiment, the sidewalls of the backside insulating material portion are free of any lateral step. In one embodiment, the sidewalls of the backside insulating material portion have a straight vertical cross-sectional profile that extends from a topmost surface of the backside insulating material portion to a bottommost surface of the backside insulating material portion.

In one embodiment, the sidewalls of the backside insulating material portion (such as the insulating spacer 74) comprise a pair of lengthwise sidewalls that laterally extend straight along a first horizontal direction (e.g., word line direction) hd1 in a horizontal cross-sectional view. In one embodiment, each of the dielectric spacer plates 75C laterally extends straight along the first horizontal direction hd1 with a respective uniform lateral thickness.

In one embodiment, the backside trench fill structure (74, 76) comprises a backside contact via structure 76 that is laterally surrounded by the backside insulating material portion (such as the insulating spacer 74), vertically extends through each layer within the alternating stack (32, 46), and contacts a top surface of a portion of the substrate (9, 10).

In one embodiment, the memory device comprises backside blocking dielectric layers 44 located between each vertically neighboring pair of an insulating layer 32 among the insulating layers 32 and an electrically conductive layer 46 among the electrically conductive layers 46, wherein: a first subset of the backside blocking dielectric layers 44 that is in contact with the first electrically conductive layers 461 is laterally spaced from the backside insulating material portion (such as the insulating spacer 74); and a second subset of the backside blocking dielectric layers 44 that is in contact with the second electrically conductive layers 462 is in contact with the backside insulating material portion (such as the insulating spacer 74).

In one embodiment, the vertical stack of memory elements comprises portions of a charge storage layer (e.g., comprising the memory material layer 54) located at the levels of the electrically conductive layers 46; and the memory opening fill structure 58 comprises a blocking dielectric layer 52 laterally surrounding the charge storage layer, and a tunneling dielectric layer (e.g., the dielectric material liner 56) located between the charge storage layer and the vertical semiconductor channel 60.

Referring FIGS. 17A to 18, and according to the alternative embodiment of the present disclosure, a memory device includes an alternating stack of insulating layers 32 and electrically conductive layers 46; a memory opening 49 vertically extending through the alternating stack (32, 46); a memory opening fill structure 58 located in the memory opening 49 and comprising a vertical semiconductor channel 60 and a memory film 50. The electrically conductive layers 46 comprise a vertically alternating sequence of first electrically conductive layers 461 and second electrically conductive layers 462 that are interlaced along a vertical direction. The memory film 50 contains first lateral recesses 431R located at levels of the first electrically conductive layers 461. The memory film contains no lateral recesses or second lateral recesses having a smaller lateral width than the first lateral recesses located at levels of the second electrically conductive layers 461.

In one embodiment, the memory film 50 comprises a blocking dielectric layer 52 laterally surrounding a charge storage layer (e.g., the memory material layer 54_, and a tunneling dielectric layer located between the charge storage layer and the vertical semiconductor channel 60, and the first lateral recesses 431R extend into the blocking dielectric layer 52.

The exemplary structures can include a three-dimensional memory device. In one embodiment, the three-dimensional memory device comprises a three-dimensional NAND memory device. The electrically conductive layers 46 can comprise, or can be electrically connected to, a respective word line of the three-dimensional NAND memory device. The substrate (9, 10) can comprise a silicon substrate. The vertical NAND memory device can comprise an array of three-dimensional NAND strings over the silicon substrate. The silicon substrate can contain an integrated circuit comprising a driver circuit (comprising a subset of the least one semiconductor device 700) for the memory device located thereon. The electrically conductive layers 46 can comprise a plurality of control gate electrodes having a strip shape extending substantially parallel to the top surface of the substrate (9, 10, 61), e.g., between a pair of backside trenches 79. The plurality of control gate electrodes comprises at least a first control gate electrode located in a first device level and a second control gate electrode located in a second device level. In one embodiment, the array of three-dimensional NAND strings can comprise: a plurality of semiconductor channels (59, 11, 60); and a plurality of charge storage elements (as comprising portions of the memory films 50, i.e., portions of the memory material layer 54). Each charge storage element can be located adjacent to a respective one of the plurality of semiconductor channels (59, 11, 60).

The various embodiments of the present disclosure provide enhanced structural support during replacement of the sacrificial material layers 42 with electrically conductive layers 46. Specifically, replacement of the sacrificial material layers 42 with electrically conductive layers 46 is performed employing two separate replacement processing sequences in which the first sacrificial material layers 421 are replaced with first electrically conductive layers 461 first, and the second sacrificial material layers 422 are replaced with second electrically conductive layers 462 subsequently (i.e., after forming the first electrically conductive layers). As such, during each replacement process, only about 25% of the volumes of the layer stack including the insulating layers 32 and the sacrificial material layers 42 are removed to form recesses, and about 75% of the volumes of the layer stack comprise solid materials, which provide enhanced structural support, and prevent or reduce collapse of the layer stack during the presence of the backside recesses 43.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
    an alternating stack of insulating layers and electrically conductive layers;
    a memory opening vertically extending through the alternating stack;
    a memory opening fill structure located in the memory opening and comprising a vertical semiconductor channel and a vertical stack of memory elements located at levels of the electrically conductive layers;
    a backside trench vertically extending through the alternating stack; and
    a backside trench fill structure comprising a backside insulating material portion, wherein:
    the electrically conductive layers comprise a vertically alternating sequence of first electrically conductive layers and second electrically conductive layers that are interlaced along a vertical direction;
    each of the first electrically conductive layers is laterally spaced from the backside insulating material portion by a respective dielectric spacer plate; and
    each of the second electrically conductive layers is in direct contact with the backside insulating material portion.

2. The memory device of claim 1, wherein:
    the backside insulating material portion comprises sidewalls that vertically extend at least from a topmost layer in the alternating stack to a top surface of a substrate underlying the alternating stack; and
    each of the second electrically conductive layers is in direct contact with one of the sidewalls of the backside insulating material portion.

3. The memory device of claim 2, wherein the sidewalls of the backside insulating material portion are free of any lateral step.

4. The memory device of claim 2, wherein the sidewalls of the backside insulating material portion have a straight vertical cross-sectional profile that extends from a topmost surface of the backside insulating material portion to a bottommost surface of the backside insulating material portion.

5. The memory device of claim 2, wherein the sidewalls of the backside insulating material portion comprise a pair of lengthwise sidewalls that laterally extend straight along a first horizontal direction in a horizontal cross-sectional view.

6. The memory device of claim 5, wherein each of the dielectric spacer plates laterally extends straight along the first horizontal direction with a respective uniform lateral thickness.

7. The memory device of claim 2, wherein the backside trench fill structure comprises a backside contact via structure that is laterally surrounded by the backside insulating material portion, vertically extending through each layer within the alternating stack, and contacts a top surface of a portion of the substrate.

8. The memory device of claim 1, further comprising backside blocking dielectric layers located between each vertically neighboring pair of an insulating layer among the insulating layers and an electrically conductive layer among the electrically conductive layers, wherein:
    a first subset of the backside blocking dielectric layers that is in contact with the first electrically conductive layers is laterally spaced from the backside insulating material portion; and
    a second subset of the backside blocking dielectric layers that is in contact with the second electrically conductive layers is in contact with the backside insulating material portion.

9. The memory device of claim 1, wherein:
    the vertical stack of memory elements comprises portions of a charge storage layer located at the levels of the electrically conductive layers; and
    the memory opening fill structure comprises a blocking dielectric layer laterally surrounding the charge storage layer and a tunneling dielectric layer located between the charge storage layer and the vertical semiconductor channel.

10. A memory device, comprising:
    an alternating stack of insulating layers and electrically conductive layers;
    a memory opening vertically extending through the alternating stack; and
    a memory opening fill structure located in the memory opening and comprising a vertical semiconductor channel and a memory film;
    wherein:
    the electrically conductive layers comprise a vertically alternating sequence of first electrically conductive layers and second electrically conductive layers that are interlaced along a vertical direction;
    the memory film contains first lateral recesses located at levels of the first electrically conductive layers; and
    the memory film contains no lateral recesses or second lateral recesses having a smaller lateral width than the first lateral recesses located at levels of the second electrically conductive layers.

11. The memory device of claim 10, wherein the memory film contains no lateral recesses located at the levels of the second electrically conductive layers.

12. The memory device of claim 10, wherein the memory film contains the second lateral recesses located at the levels of the second electrically conductive layers.

13. The memory device of claim 10, wherein:
    the memory film comprises a blocking dielectric layer laterally surrounding a charge storage layer, and a tunneling dielectric layer located between the charge storage layer and the vertical semiconductor channel; and
    the first lateral recesses extend into the blocking dielectric layer.

* * * * *